United States Patent
Salih et al.

(10) Patent No.: US 12,247,281 B2
(45) Date of Patent: Mar. 11, 2025

(54) METHOD FOR COATING A SUBSTRATE WITH A CO-PI MODIFIED BiVO$_4$/WO$_3$ HETEROSTRUCTURE FILM

(71) Applicant: KING FAHD UNIVERSITY OF PETROLEUM AND MINERALS, Dhahran (SA)

(72) Inventors: Amar Kamal Mohmeadkhair Salih, Dhahran (SA); Qasem Ahmed Qasem Drmosh, Dhahran (SA); Tarek Kandiel, Dhahran (SA); Zain Hassan Yamani, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 151 days.

(21) Appl. No.: 17/971,683

(22) Filed: Oct. 24, 2022

(65) Prior Publication Data
US 2024/0133017 A1  Apr. 25, 2024
US 2024/0229218 A9  Jul. 11, 2024

(51) Int. Cl.
*C23C 14/00*  (2006.01)
*C23C 14/08*  (2006.01)
(Continued)

(52) U.S. Cl.
CPC ........ *C23C 14/0036* (2013.01); *C23C 14/083* (2013.01); *C23C 14/086* (2013.01);
(Continued)

(58) Field of Classification Search
None
See application file for complete search history.

(56) References Cited

U.S. PATENT DOCUMENTS 9,567,680 B2   2/2017 Kim et al.
10,137,435 B2  11/2018 Artero et al.
(Continued)

FOREIGN PATENT DOCUMENTS

CN       112266045 A     1/2021
WO    WO 2016/136374 A1  9/2016

OTHER PUBLICATIONS

Liu et al. ACS Appl. Energy Mater. 2021, 4, 2864-2872 (Year: 2021).*

(Continued)

*Primary Examiner* — Wojciech Haske
(74) *Attorney, Agent, or Firm* — Oblon, McClelland, Maier & Neustadt, L.L.P.

(57) ABSTRACT

A method for coating a substrate with a Co-Pi modified BiVO$_4$/WO$_3$ heterostructure film includes direct current reactive sputtering tungsten (W) onto a substrate in a gaseous mixture containing oxygen to form a tungsten trioxide (WO$_3$) film, direct current reactive sputtering bismuth (Bi) onto the tungsten trioxide (WO$_3$) film in a gaseous mixture containing oxygen to form a dibismuth trioxide (Bi$_2$O$_3$) film, drop-casting a vanadyl acetylacetonate solution onto the Bi$_2$O$_3$ film and heating at a temperature of at least 450° C. in ambient air to convert the Bi$_2$O$_3$ film to a BiVO$_4$ film, and photoelectrochemically coating the BiVO$_4$ film with a cobalt-phosphate (Co-Pi) to form a modified film on the surface of the substrate. A photoanode containing the Co-Pi modified BiVO$_4$/WO$_3$ heterostructure film prepared by the method, and its application in water splitting.

17 Claims, 16 Drawing Sheets

(51) Int. Cl.
   *C23C 18/12*    (2006.01)
   *C23C 28/00*    (2006.01)
   *C25B 1/04*     (2021.01)
   *C25B 1/55*     (2021.01)
   *C25B 11/091*   (2021.01)
   *C25D 3/56*     (2006.01)
   *C25D 5/00*     (2006.01)

(52) U.S. Cl.
   CPC ...... *C23C 18/1208* (2013.01); *C23C 18/1295* (2013.01); *C23C 28/345* (2013.01); *C25B 1/04* (2013.01); *C25B 1/55* (2021.01); *C25B 11/091* (2021.01); *C25D 3/562* (2013.01); *C25D 5/011* (2020.08)

(56)           References Cited

U.S. PATENT DOCUMENTS 10,487,408 B2   11/2019   Rothschild et al.
   10,626,510 B2    4/2020   HernáNdez Alonso et al.

OTHER PUBLICATIONS

Chen et al. J. Phys. Chem. C 2013, 117, 21635-21642 (Year: 2013).*
Nguyen Duc et al., "Optimization of photogenerated charge transport using type-II heterojunction structure of CoP/BiVO$_4$:WO$_3$ for high efficient solar-driver water splitting", Journal of Alloys and Compounds, vol. 899, Dec. 17, 2021, 2 pages (Abstract only).
Yuriy Pihosh, et al., "Nanostructured WO$_3$/BiVO$_4$ Photoanodes for Efficient Photoelectrochemical Water Splitting", Small, vol. 10, No. 18, Sep. 2014, pp. 3692-3699.

* cited by examiner

METHOD FOR COATING A SUBSTRATE WITH A CO-PI MODIFIED $BiVO_4/WO_3$ HETEROSTRUCTURE FILM

BACKGROUND

Technical Field

The present disclosure is directed to a method for coating a substrate with a heterostructure film and a method for splitting water with the coated substrate, and particularly, to the method for coating a substrate with a Co-Pi modified $BiVO_4/WO_3$ heterostructure film, and the method for photoelectrochemical water oxidation with the Co-Pi modified $BiVO_4/WO_3$ heterostructure film coated substrate.

DESCRIPTION OF RELATED ART

The "background" description provided herein is to generally present the context of the disclosure. Work of the presently named inventors, to the extent it is described in this background section, as well as aspects of the description that may not otherwise qualify as prior art at the time of filing, are neither expressly nor impliedly admitted as prior art against the present invention.

Photoelectrochemical (PEC) water splitting technology provides a realistic method for solar energy storage and conversion [Swierk, J. R.; Mallouk, T. E. Correction: Design and development of photoanodes for water-splitting dye-sensitized photoelectrochemical cells. *Chemical Society Reviews* 2017, 46, 559-559; Duan, L.; Tong, L.; Xu, Y.; Sun, L. Visible light-driven water oxidation—from molecular catalysts to photoelectrochemical cells. *Energy & Environmental Science* 2011, 4, 3296-3313; and Walter, M. G.; Warren, E. L.; McKone, J. R.; Boettcher, S. W.; Mi, Q.; Santori, E. A.; Lewis, N. S. Solar water splitting cells. *Chemical reviews* 2010, 110, 6446-6473]. In the process of PEC water splitting, the anode and cathode are p- and n-type semiconductor materials which are connected to produce hydrogen ($H_2$) and oxygen ($O_2$) gases, respectively. The oxygen evolution reaction (also known as OER) that occurs at the anode during photocatalytic water splitting is essential to enhancing the efficiency of solar energy conversion. OER includes a kinetically unfavorable four electrons transmission to liberate an oxygen molecule and so is a rate-limiting step in the overall reaction process compared to the two-electron transmission process in case of the hydrogen production reaction [Ali, M.; Pervaiz, E.; Sikandar, U.; Khan, Y. A review on the recent developments in zirconium and carbon-based catalysts for photoelectrochemical water-splitting. *International Journal of Hydrogen Energy* 2021]. Several technologies and methods have been developed to improve the efficiency of each step in water splitting. The use of titanium dioxide as photoanode in water oxidation triggers a worldwide search for new metal oxides semiconductor photoanodes like $WO_3$, $Fe_2O_3$, and $BiVO_4$ [Fujishima, A.; Honda, K. Electrochemical photolysis of water at a semiconductor electrode. *nature* 1972, 238, 37-38; Luo, H.; Liu, C.; Xu, Y.; Zhang, C.; Wang, W.; Chen, Z. An ultra-thin NiOOH layer loading on $BiVO_4$ photoanode for highly efficient photoelectrochemical water oxidation. *International Journal of Hydrogen Energy* 2019, 44, 30160-30170; Zhang, R.; Fang, Y.; Chen, T.; Qu, F.; Liu, Z.; Du, G.; Asiri, A. M.; Gao, T.; Sun, X. Enhanced photoelectrochemical water oxidation performance of $Fe_2O_3$ nanorods array by S doping. *ACS Sustainable Chemistry & Engineering* 2017, 5, 7502-7506; Mohamedkhair, A. K.; Drmosh, Q. A.; Qamar, M.; Yamani, Z. H. Tuning Structural Properties of $WO_3$ Thin Films for Photoelectrocatalytic Water Oxidation. *Catalysts* 2021, 11, 381; Khan, A. Z; Kandiel, T. A.; Abdel-Azeim, S.; Alhooshani, K. Boosting the efficiency of water oxidation via surface states on hematite photoanodes by incorporating $Bi^{3+}$ ions. *Sustainable Energy & Fuels* 2020, 4, 4207-4218; and Khan, I.; Khan, A. Z.; Sufyan, A.; Khan, M. Y.; Basha, S. I.; Khan, A. Ultrasonically controlled growth of monodispersed octahedral $BiVO_4$ microcrystals for improved photoelectrochemical water oxidation. *Ultrasonics Sonochemistry* 2020, 68, 105233]. Among these materials, $BiVO_4$ has been brought under the spotlight due to its adequate valence band (VB) edge located at around 2.4 eV vs. RHE (reversible hydrogen electrode), which is thermodynamically favorable for water oxidation. Moreover, under typical solar light illumination, its small bandgap achieves about 9.2 percent sun-to-hydrogen conversion efficiency (STH) [Huang, Z-F.; Pan, L.; Zou, J.-J.; Zhang, X.; Wang, L. Nanostructured bismuth vanadate-based materials for solar-energy-driven water oxidation: a review on recent progress. Nanoscale 2014, 6, 14044-14063; and Zhao, F.; Li, N.; Wu, Y.; Wen, X.; Zhao, Q.; Liu, G.; Li, J. $BiVO_4$ photoanode decorated with cobalt-manganese layered double hydroxides for enhanced photoelectrochemical water oxidation. *International Journal of Hydrogen Energy* 2020, 45, 31902-31912]. However, several technical challenges still remain, for instance, its quick charge recombination, sluggish consumption of photogenerated charge carriers for surface reactions, and weak light absorption [Grätzel, M. Photoelectrochemical cells. In *Materials For Sustainable Energy: A Collection of Peer-Reviewed Research and Review Articles from Nature Publishing Group*, World Scientific: 2011; pp. 26-32; Yin, C.; Zhu, S.; Chen, Z.; Zhang, W.; Gu, J.; Zhang, D. One step fabrication of C-doped $BiVO_4$ with hierarchical structures for a high-performance photocatalyst under visible light irradiation. *Journal of Materials Chemistry A* 2013, 1, 8367-8378; and Abdi, F. F.; Firet, N.; van de Krol, R. Efficient BiVO4 thin film photoanodes modified with Cobalt Phosphate catalyst and W-doping. *ChemCatChem* 2013, 5, 490-496].

Hetero-structured semiconductors enable the incorporation of two or more materials into a single electrode, resulting in superior photo-electrocatalytic performance [Luo, Z.; Wang, T.; Zhang, J.; Li, C.; Li, H.; Gong, J. Dendritic hematite nanoarray photoanode modified with a conformal titanium dioxide interlayer for effective charge collection. *Angewandte Chemie International Edition* 2017, 56, 12878-12882; Sivula, K.; Formal, F. L.; Gratzel, M. $WO_3$—$Fe_2O_3$ photoanodes for water splitting: A host scaffold, guest absorber approach. *Chemistry of Materials* 2009, 21, 2862-2867; and Yin, X.; Liu, Q.; Yang, Y.; Liu, Y.; Wang, K.; Li, Y.; Li, D.; Qiu, X.; Li, W.; Li, J. An efficient tandem photoelectrochemical cell composed of $FeOOH/TiO_2/BiVO_4$ and $Cu_2O$ for self-driven solar water splitting. *International Journal of Hydrogen Energy* 2019, 44, 594-604]. Moreover, coupling materials with matching valence and conduction band locations may offer a thermodynamic driving force for charge separation [Pan, Q.; Li, A.; Zhang, Y.; Yang, Y.; Cheng, C. Rational design of 3D hierarchical ternary $SnO2/TiO_2/BiVO_4$ arrays photoanode toward efficient photoelectrochemical performance. *Advanced Science* 2020, 7, 1902235; Pan, Q.; Zhang, H.; Yang, Y.; Cheng, C. 3D Brochosomes-Like $TiO_2/WO_3/BiVO_4$ Arrays as Photoanode for Photoelectrochemical Hydrogen Production. *Small* 2019, 15, 1900924; Kodan, N.; Ahmad, M.; Mehta, B. Charge carrier separation and enhanced PEC properties of $BiVO_4$ based heterojunctions having ultrathin overlayers.

*International Journal of Hydrogen Energy* 2021, 46, 189-196; Bai, S.; Li, Q.; Han, J.; Yang, X.; Shu, X.; Sun, J.; Sun, L.; Luo, R.; Li, D.; and Chen, A. Photoanode of LDH catalyst decorated semiconductor heterojunction of $BiVO_4$/CdS to enhance PEC water splitting efficiency. *International Journal of Hydrogen Energy* 2019, 44, 24642-24652]. Shao et al. discloses a $BiVO_4/WO_3$ heterostructure for electro/hole separation [Shao, P.-W.; Siao, Y.-S.; Lai, Y.-H.; Hsieh, P.-Y.; Tsao, C.-W.; Lu, Y.-J.; Chen, Y.-C.; Hsu, Y.-J.; Chu, Y.-H. Flexible $BiVO_4/WO_3$/ITO/Muscovite Heterostructure for Visible-Light Photoelectrochemical Photoelectrode. *ACS Applied Materials & Interfaces* 2021, 13, 21186-21193]. The addition of $WO_3$ improves the charge transfer capabilities of the $BiVO_4/WO_3$ photoanode, which generates significant interest in its application in photoelectrochemical water oxidation. In addition, Liu et al. [Liu, J.; Chen, W.; Sun, Q.; Zhang, Y.; Li, X.; Wang, J.; Wang, C.; Yu, Y.; Wang, L.; Yu, X. Oxygen Vacancies Enhanced $WO_3/BiVO_4$ Photoanodes Modified by Cobalt Phosphate for Efficient Photoelectrochemical Water Splitting. *ACS Applied Energy Materials* 2021, 4, 2864-2872] discloses a hydrothermal technique for the fabrication of a $WO_3$ layer which is further dip-coated by a $BiVO_4$ layer. The formed $BiVO_4/WO_3$ heterostructure film may be further decorated with oxygen evolution catalysts to increase the rate of water oxidation. Suitable oxygen evolution catalysts can include but not limited to Co-Pi [Zachäus, C.; Abdi, F. F.; Peter, L. M.; Van De Krol, R. Photocurrent of $BiVO_4$ is limited by surface recombination, not surface catalysis. *Chemical Science* 2017, 8, 3712-3719; and Ma, Y.; Kafizas, A.; Pendlebury, S. R.; Le Formal, F.; Durrant, J. R. Photoinduced absorption spectroscopy of CoPi on $BiVO_4$: the function of CoPi during water oxidation. *Advanced Functional Materials* 2016, 26, 4951-4960], CoFe—Prussian blue (PB) catalysts [Hegner, F. S.; Herraiz-Cardona, I.; Cardenas-Morcoso, D.; López, N.r.; Galán-Mascarós, J.-R.n.; Gimenez, S. Cobalt hexacyanoferrate on $BiVO_4$ photoanodes for robust water splitting. *ACS applied materials & interfaces* 2017, 9, 37671-37681], and Ni/FeOOH metal oxyhydroxide-based catalysts [Wang, S.; Chen, P.; Bai, Y.; Yun, J. H.; Liu, G.; Wang, L. New $BiVO_4$ Dual Photoanodes with Enriched Oxygen Vacancies for Efficient Solar-Driven Water Splitting. *Advanced Materials* 2018, 30, 1800486], etc. Furthermore, Madhavi et al. [Madhavi, V.; Kondaiah, P.; Shaik, H.; Kumar, K. N.; Naik, T. S. K.; Rao, G. M.; Ramamurthy, P. C. Fabrication of porous 1D $WO_3$ NRs and $WO_3/BiVO_4$ hetero junction photoanode for efficient photoelectrochemical water splitting. *Materials Chemistry and Physics* 2021, 274, 125095] describes an example of preparing a $BiVO_4/WO_3$ heterostructure photoanode using a DC reactive magnetron sputtering method, and the photoanode prepared exhibits increased photocurrent density.

Practical approaches have been developed in the art for the improvement of water splitting efficiency, however, these approaches often involve a time consuming and tedious process, as well as lack of control over the morphology of the newly formed $BiVO_4/WO_3$ heterostructure film, resulting in a limited improvement of charge carrier separation and transport, and thus negatively impacting the performance of the photoelectrode. Hence, there is a need for the development of uniform and pinhole-free $BiVO_4/WO_3$ heterostructures and simple synthesis protocol.

In view of the foregoing, one objective of the present disclosure is to provide a method for coating a substrate with a Co-Pi modified $BiVO_4/WO_3$ heterostructure film. A further objective of the present disclosure is to provide a method for water oxidation with a photoanode containing the Co-Pi modified $BiVO_4/WO_3$ heterostructure film.

SUMMARY

In an exemplary embodiment, a method for coating a substrate with a Co-Pi modified $BiVO_4/WO_3$ heterostructure film is described. The method for coating the substrate with the Co-Pi modified $BiVO_4/WO_3$ heterostructure film includes direct current reactive sputtering tungsten (W) onto a substrate in a gaseous mixture comprising oxygen to form a tungsten trioxide ($WO_3$) film on the substrate. The method also includes direct current reactive sputtering bismuth (Bi) onto the tungsten trioxide ($WO_3$) film in a gaseous mixture comprising oxygen to form a dibismuth trioxide ($Bi_2O_3$) film on the $WO_3$ film. In addition, the method includes drop-casting a vanadyl acetylacetonate solution onto the $Bi_2O_3$ film and heating at a temperature of at least 450° C. in ambient air to convert the $Bi_2O_3$ film to a $BiVO_4$ film. The $BiVO_4$ film is a porous film comprising crystalline $BiVO_4$. Moreover, the method involves immersing the $BiVO_4$ film on the substrate in an aqueous mixture containing a cobalt salt and a phosphate salt, and photoelectrochemically coating the $BiVO_4$ film with a cobalt-phosphate (Co-Pi) to form a modified film on the surface of the substrate.

In some embodiments, direct current reactive sputtering tungsten onto the substrate is carried out at a power of 50 to 200 watts (W) for 1 to 30 minutes and the gaseous mixture is introduced at a flow rate of 50 to 100 standard cubic centimeters per minute (sccm).

In some embodiments, a distance of tungsten source to the substrate is in a range of 5 to 20 centimeters (cm).

In some embodiments, direct current reactive sputtering bismuth onto the $WO_3$ film is carried out at a power of 5 to 50 W for 1 to 30 minutes and the gaseous mixture is introduced at a flow rate of 10 to 70 sccm.

In some embodiments, a base pressure of the sputtering is maintained at $1\times10^{-6}$ to $20\times10^{-6}$ torr, and a working pressure of the sputtering is maintained at $1\times10'$ to $10\times10^{-3}$ torr.

In some embodiments, the $WO_3$ film is heated in ambient air at a temperature of at least 500° C. for 1 to 3 hours with a heating ramp rate of 10 to 30° C./min.

In some embodiments, the heating of the $Bi_2O_3$ film after drop casting is carried out for 1 to 3 hours with a heating ramp rate of 0.5 to 5° C./min.

In some embodiments, the gaseous mixture comprises oxygen gas and argon gas. In some embodiments, a volume ratio of oxygen gas to argon gas is in a range of 1:10 to 10:1.

In some embodiments, the $WO_3$ film has a uniform sheet-like morphology.

In some embodiments, the $WO_3$ film has an average thickness of 50 to 250 nanometers (nm).

In some embodiments, the $WO_3$ film has a photocurrent density of 0.5 to 1 milliamperes per square centimeter (mA $cm^{-2}$) at 1.23 $V_{RHE}$.

In some embodiments, the $Bi_2O_3$ film has an interparticle porosity structure, and is uniformly deposited on the surface of the $WO_3$ film.

In some embodiments, the $BiVO_4$ film has an average pore size of 0.01 to 1 micrometer (μm).

In some embodiments, the $BiVO_4$ film has an average thickness of 100 to 600 nm.

In some embodiments, the $BiVO_4$ film has a photocurrent density of 0.8 to 1.5 mA $cm^{-2}$ at 1.23 $V_{RHE}$.

In some embodiments, the Co-Pi modified BiVO$_4$/WO$_3$ heterostructure film is uniform and pinhole-free, and comprises a plurality of Co-Pi particles uniformly distributed on the modified film.

In some embodiments, the Co-Pi particles have an average particle size of 20 to 200 nm. In some embodiments, the Co-Pi modified BiVO$_4$/WO$_3$ heterostructure film has a thickness in a range of 150 to 850 nm.

In another exemplary embodiment, the method for coating the substrate with the Co-Pi modified BiVO$_4$/WO$_3$ heterostructure film further includes mixing at least one cobalt (Co) salt and at least one phosphate (Pi) salt in a liquid to form the aqueous mixture having a pH value ranging from 5.5 to 7.5. In some embodiments, a molar ratio of Co to Pi is in a range of 1:50 to 1:400. In addition, the method also includes adding the aqueous mixture to a photoelectrochemical cell connected to a power supply, and at least partially immersing the substate coated with the BiVO$_4$ film in the aqueous mixture. In some embodiments, the substrate is a fluorinated tin oxide (FTO) glass. Furthermore, the method involves applying a potential to the aqueous mixture via the substrate to form a plurality of cobalt-phosphate (Co-Pi) particles on the surface of the BiVO$_4$ film, and removing the substrate from the aqueous mixture and drying to form the modified film on the surface of the substrate.

In some embodiments, the cobalt salt is at least one selected from the group consisting of cobalt sulfide, cobalt fluoride, cobalt naphthenate, cobalt acetate, cobalt monoantimonide, cobalt oxide, cobalt triantimonide, cobalt hydroxide, cobalt chloride, cobalt thiocyanate, cobalt acetylacetonate, cobalt sulfate, cobalt carbonyl, cobalt nitrate, cobalt bromide, and/or a hydrate thereof.

In some embodiments, wherein the phosphate salt is at least one selected from the group consisting of sodium phosphate, sodium phosphate dibasic, sodium phosphate monobasic, potassium phosphate, potassium phosphate dibasic, potassium phosphate monobasic, and/or a hydrate thereof.

In a further exemplary embodiment, a photoanode containing the Co-Pi modified BiVO$_4$/WO$_3$ heterostructure film prepared by the method disclosed herein on a substrate. In some embodiments, the substrate is a fluorinated tin oxide (FTO) glass.

In some embodiments, the photoelectrode has a photocurrent density of 2 to 5 mA cm$^{-2}$ at a potential of 1.23 V$_{RHE}$.

In some embodiments, the photoelectrode has an incident photon-to-current conversion efficiency (IPCE) up to 30% at 430 nm wavelength.

In yet another exemplary embodiment, the method for coating the substrate with the Co-Pi modified BiVO$_4$/WO$_3$ heterostructure film further includes irradiating the substrate coated by the modified film and water in a photoelectrochemical cell with electromagnetic radiation to form hydrogen and oxygen.

In some embodiments, the substrate is a fluorinated tin oxide (FTO) glass.

In some embodiments, the electromagnetic radiation is sunlight.

The foregoing general description of the illustrative present disclosure and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
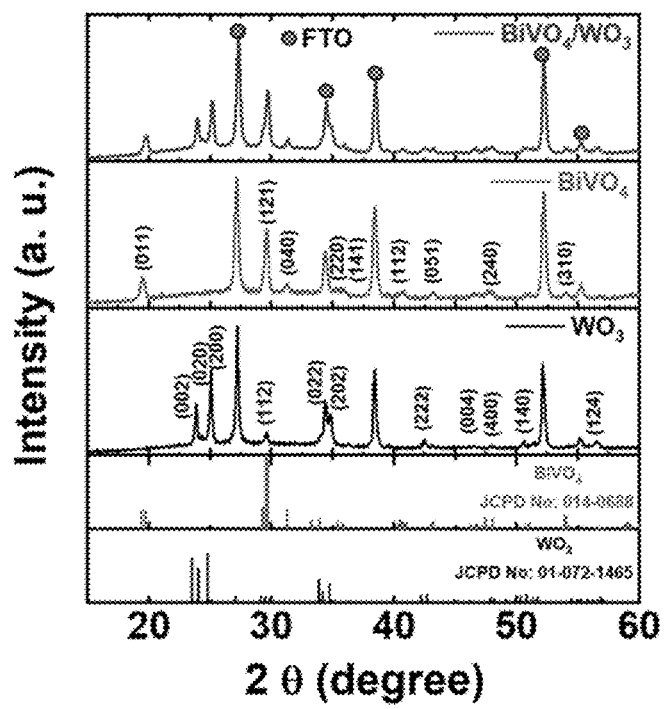
FIG. 1 illustrates an overlay of X-ray diffraction patterns of WO$_3$, BiVO$_4$, and BiVO$_4$/WO$_3$ films, according to certain embodiments.

In the following description, it is understood that other embodiments may be utilized, and structural and operational changes may be made without departure from the scope of the present embodiments disclosed herein.

Embodiments of the present disclosure will now be described more fully hereinafter with reference to the accompanying drawings, in which some, but not all embodiments of the disclosure are shown. In the drawings, like reference numerals designate identical or corresponding parts throughout the several views.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Although the open-ended term "comprising," as a synonym of terms such as including, containing, or having, is use herein to describe and claim the present composition and methods, the composition and/or methods may alternatively be described using more limiting terms, such as "consisting of" or "consisting essentially of" the recited components/steps. For example, a composition which consists essentially of the recited components may contain other components which do not adversely affect the photoelectrochemical properties of the composition.

Furthermore, the terms "approximately," "approximate," "about," and similar terms generally refer to ranges that include the identified value within a margin of 20%, 10%, or preferably 5%, and any values there between.

As used herein, the words "a" and "an" and the like carry the meaning of "one or more". Within the description of this disclosure, where a numerical limit or range is stated, the endpoints are included unless stated otherwise. Also, all values and subranges within a numerical limit or range are specifically included as if explicitly written out.

As used herein, the terms "optional" or "optionally" means that the subsequently described event(s) can or cannot occur or the subsequently described component(s) may or may not be present (e.g., 0 wt. %).

As used herein, the terms "direct current reactive sputtering" or "DC" and similar terms generally refer to a thin film physical vapor deposition coating technique that uses ionized gas molecules to vaporize (sputter) molecules off the target material into plasma. The "direct current reactive sputtering" is usually carried out in a sputtering system, for example, a model NSC-4000 sputtering system by Nanomaster. The system normally includes a chamber, a pump and source configurations for depositing metals and dielectric thin films on to substrates.

Growing metal oxide thin layers in the form of heterostructure is an efficient approach to address the challenge of charge carrier separation and transport in photoelectrochemical (PEC) cells. As described herein, a heterostructure film consisting of $BiVO_4$ and $WO_3$ ($BiVO_4/WO_3$) has shown an enormous potential for PEC water oxidation. According to the present disclosure, the $BiVO_4/WO_3$ heterostructure film has a uniform and pinhole-free morphology through a precise morphology control. In addition, the surface of the $BiVO_4/WO_3$ can be modified with a hole scavenger (Co-Pi) co-catalyst at loading levels. The combination of precise morphology control over the $BiVO_4/WO_3$ film and Co-Pi catalyst further improves the photocatalytic performance of the heterostructure film as a part of the photoelectrode.

According to a first aspect, the present disclosure relates to a method for coating a substrate with a Co-Pi modified $BiVO_4/WO_3$ heterostructure film. The method for coating the substrate involves (i) direct current reactive sputtering tungsten (W) onto a substrate in a gaseous mixture comprising oxygen to form a tungsten trioxide ($WO_3$) film on the substrate, (ii) direct current reactive sputtering bismuth (Bi) onto the tungsten trioxide ($WO_3$) film in a gaseous mixture comprising oxygen to form a dibismuth trioxide ($Bi_2O_3$) film on the $WO_3$ film, (iii) drop-casting a vanadyl acetylacetonate solution onto the $Bi_2O_3$ film and heating at a temperature of at least 450° C. in ambient air to convert the $Bi_2O_3$ film to a $BiVO_4$ film, (iv) immersing the $BiVO_4$ film on the substrate in an aqueous mixture containing a cobalt salt and a phosphate salt, and (v) photoelectrochemically coating the $BiVO_4$ film with a cobalt-phosphate (Co-Pi) to form a modified film on the surface of the substrate.

Figure 11:
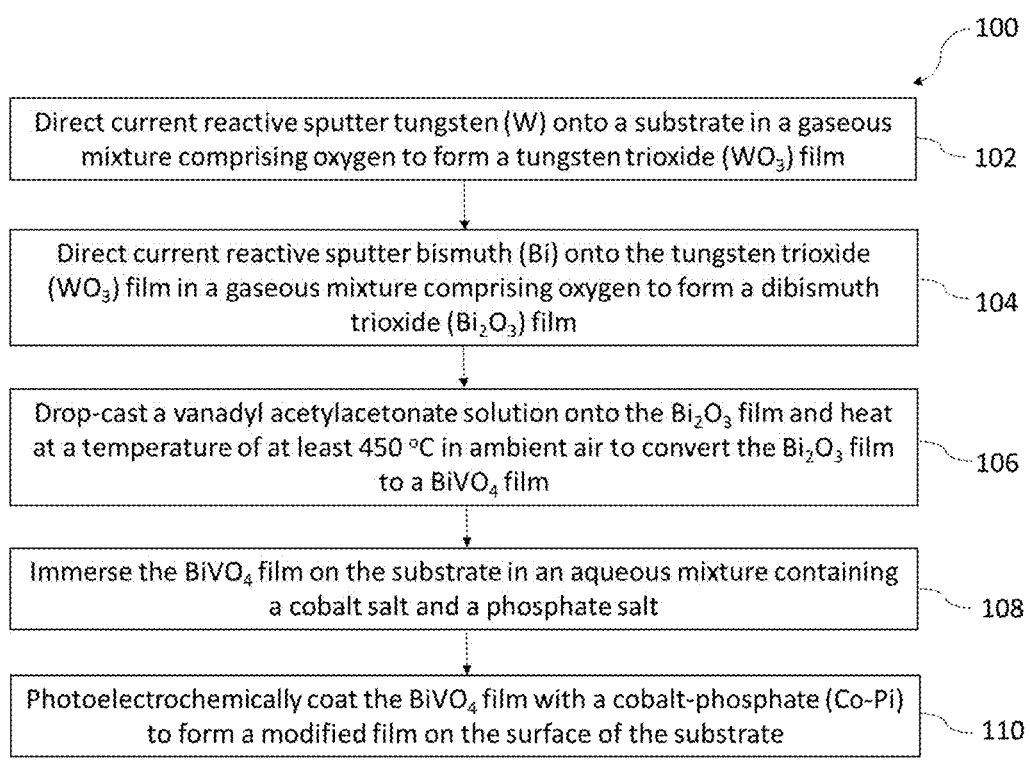
FIG. 11 is a schematic flow diagram of a method for coating a substrate with a Co-Pi modified $BiVO_4/WO_3$ heterostructure film, according to certain embodiments.

Referring to FIG. 11, a schematic flow diagram of a method 100 for coating a substrate with a Co-Pi modified $BiVO_4/WO_3$ heterostructure film is illustrated. The order in which the method 100 is described is not intended to be construed as a limitation, and any number of the described method steps can be combined in any order to implement the method 100.

Additionally, individual steps may be removed or skipped from the method 100 without departing from the spirit and scope of the present disclosure.

At step 102, the method 100 includes direct current reactive sputtering tungsten (W) onto a substrate in a gaseous mixture comprising oxygen to form a tungsten trioxide ($WO_3$) film on the substrate. In one embodiment, a metallic W disk is used as a sputtering target. In another embodiment, the $WO_3$ film formed through DC sputtering covers at least 25%, at least 50%, at least 75%, at least 95%, or at least 99.5% of a surface of the substrate. Exemplary substrates include fluorine doped tin oxide (FTO) film, indium tin oxide (ITO) film, ITO coated polyethylene terephthalate (PET) film, a gold film, gold coated glass, aluminum oxide, titanium oxide, nickel oxide, tungsten oxide, strontium titanate, quartz, and silicon wafer. In a preferred embodiment, the conducting substrate is selected from the group consisting of FTO (fluorine-doped tin oxide), ITO (indium tin oxide), AZO (aluminum-doped zinc oxide), GZO (gallium-doped zinc oxide), IZO (indium zinc oxide), IZTO (indium zinc tin oxide), IAZO (indium aluminum zinc oxide), IGZO (indium gallium zinc oxide), IGTO (indium gallium tin oxide), and ATO (antimony tin oxide). In a most preferred embodiment, the conducting substrate is fluorine doped tin oxide. The conducting substrate may be of any desirable shape, such as, a circle, a triangle, a rectangle, a pentagon, a hexagon, an irregular polygon, a circle, an oval, an ellipse, or a multilobe. Preferably, the conducting substrate is rectangular in shape. The conducting substrate may be attached to an additional support, such as a glass slide.

Direct current (DC) reactive sputtering may be carried out in a chamber of a sputtering system. In some embodiments, a base pressure of the sputtering in the chamber is maintained at $1\times10^{-6}$ to $20\times10^{-6}$ torr, preferably $3\times10^{-6}$ to $15\times10^{-6}$ torr, preferably $6\times10^{-6}$ to $12\times10^{-6}$ torr, or even preferably about $9\times10^{-6}$ torr. In some further embodiments, a working pressure of the sputtering in the chamber is maintained at $1\times10^{-3}$ to $10\times10^{-3}$ torr, preferably $1.5\times10^{-3}$ to $5\times10^{-3}$ torr, preferably $2\times10^{-3}$ to $4\times10^{-3}$ torr, or even preferably about $3\times10^{-3}$ torr. In some embodiments, a distance between the sputtering target and the substrate is in a range of 5 to 20 centimeters (cm), preferably 8 to 18 cm, preferably 10 to 14 cm, or even preferably about 12 cm. In some embodiments, direct current reactive sputtering tungsten onto the substrate is carried out at a power of 50 to 200 watts (W), preferably 60 to 150 W, preferably 80 to 120 W, or even preferably 120 W for a time duration of 1 to 30 minutes, preferably 1 to 15 minutes in the presence of the gaseous mixture comprising oxygen. In still some other embodiments, the gaseous mixture is introduced on to the substrate at a flow rate of 50 to 100 standard cubic centimeters per minute (sccm), preferably 60 to 80 sccm, or even preferably about 70 sccm. In yet some other embodiments, the gases mixture may further include argon, neon, krypton, and xenon. In some preferred embodiments, the gases mixture comprises oxygen and argon, in which a volume ratio of oxygen gas to argon gas is in a range of 1:10 to 10:1, preferably 1:5 to 5:1, preferably 1:2 to 2:1, or even preferably 1:1. Other ranges are also possible.

At step 102, the method 100 further includes a substrate cleaning step prior to the spurting to eliminate surface contaminants from the substrate, which involves (i) soaping and rising the substrate with deionized water, (ii) sonicating the substrate sequentially in each of deionized water, acetone, ethanol, and isopropanol, and (iii) keeping the substrate in isopropanol before sputtering. In some embodiments, the sonicating in each of deionized water, acetone, ethanol, and isopropanol is for at least 15 minutes, at least 20 minutes, at least 30 minutes, and for no more than 60 minutes, no more than 40 minutes, no more than 20 minutes. Other ranges are also possible.

As used herein, the term "annealing" or "anneal" means and includes treatment of the coated substrate so as to enable surface morphology control with temperature and time. Annealing of the coated substrate in the present disclosure may be achieved by various methods known in the art, including, but not limited to (i) thermal annealing (in a vacuum, in an inert atmosphere, or in ambient air), (ii) solvent vapor-assisted annealing (either at or above room temperature), or (iii) supercritical fluid-assisted annealing. As a specific example, thermal annealing of the coated substrate may be conducted by exposing the coated substrate to an elevated temperature for a suitable length of time. Other conventional annealing methods not described herein may also be utilized.

Accordingly, the substrate coated with the $WO_3$ film fabricated at step 102 is annealed in ambient air for a time duration of 1 to 12 hours, preferably 1.5 to 4 hours, and more preferably 2 hours at a temperature of at least 450° C., at least 500° C., or at least about 550° with a heating ramp rate of 5 to 30° C./min, preferably 8 to 16° C./min, or about 10° C./min. Other ranges are also possible.

As used herein, the term "uniform," "uniformity," or "uniformly" generally include but not limited to uniform composition, uniform particle size, uniform pore size, uniform roughness, and uniform morphology.

As used herein, the term "uniform" with respect to compositions refers to all the parts of composition are equally arranged and distributed. In some embodiments, the $WO_3$ molecules of the $WO_3$ film are equally arranged and distributed in the $WO_3$ film layer. In some embodiments, the $Bi_2O_3$ molecules of the $Bi_2O_3$ film are equally arranged and distributed in the $Bi_2O_3$ film layer. In some further embodiments, the $BiVO_4$ molecules of the $BiVO_4$ film are equally arranged and distributed in the $BiVO_4$ film layer. In some further preferred embodiments, the Co-Pi molecules are equally arranged and distributed throughout the $BiVO_4$ film layer.

The term "uniform" with respect to particle size generally refers to a composition in which individual particles have a specific range of particle diameter sizes. In some embodiments, the particles used herein are monodisperse, having a coefficient of variation or relative standard deviation, expressed as a percentage and defined as the ratio of the particle size standard deviation ($\sigma$) to the particle size mean ($\mu$) multiplied by 100 of less than 25%, preferably less than 10%, preferably less than 8%, preferably less than 6%, preferably less than 5%, preferably less than 4%, preferably less than 3%, preferably less than 2%. In a preferred embodiment, the particles used herein are monodisperse having a particle size distribution ranging from 80% of the average particle size to 120% of the average particle size, preferably 90-110%, preferably 95-105% of the average particle size.

As used herein, the term "uniform" with respect to pore size reveals that at least about 80% of the discrete pores in the $BiVO_4$ film layer may have a substantially uniform pore size. In various examples, the percentage of discrete pores in the $BiVO_4$ film layer that may have a substantially uniform pore size may be about 85%, about 90%, about 95%, about 96%, about 97%, about 98%, about 99%, about 99.5%, or about 99.9%. In some examples, all of the discrete pores in the $BiVO_4$ film layer may have a substantially uniform pore size.

As used herein, the term "uniform" with respect to roughness in connection with a polymer layer, shall mean the mean calculated by averaging the surface roughness of at least 5, and preferably at least 10, representative locations spaced approximately evenly across the portion of the article carrying the polymer layer. In some embodiments, it is preferred to measure the thickness at representative points across the longest dimension of the portion of the article that is covered with the polymer layer. The standard deviation of roughness is found by calculating the standard deviation of the local average roughness across at least 5, and preferably at least 10, representative locations spaced approximately evenly across the portion of the article carrying the polymer layer.

As used herein, the term "uniform" with respect to morphology refers to the microgeometry, shape and form of the surface texture formed on a substrate using the methods disclosed herein.

Figure 4A:
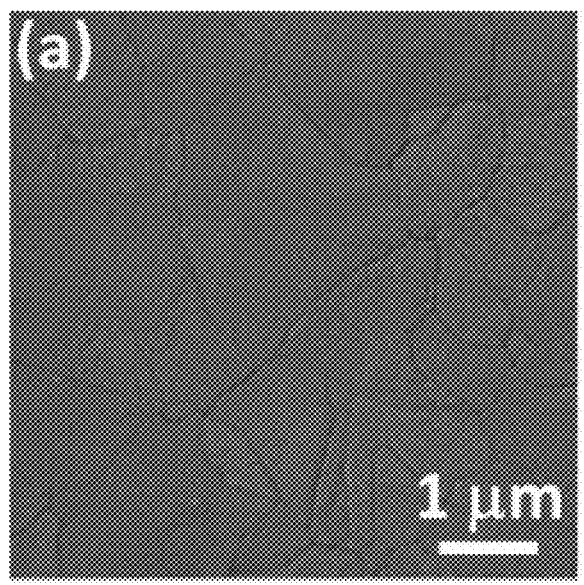
FIG. 4A is a field emission scanning electron microscope (FESEM) image of WO$_3$, according to certain embodiments.
Figure 5A:
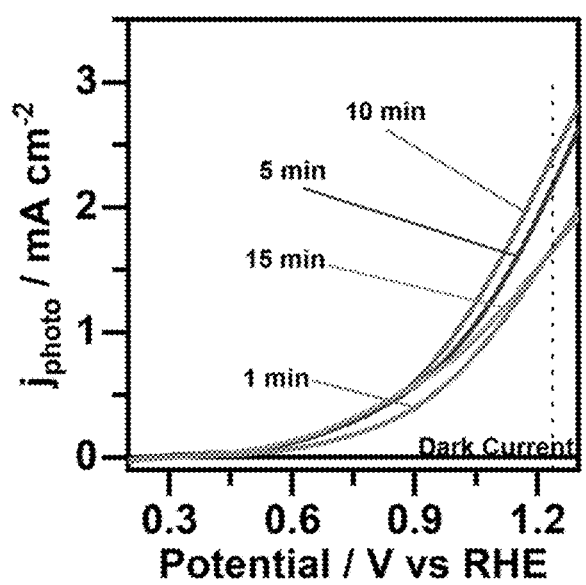
FIG. 5A is a linear sweep voltammetry (LSV) graph of BiVO$_4$/WO$_3$ samples with different WO$_3$ thicknesses, according to certain embodiments.
Figure 5B:
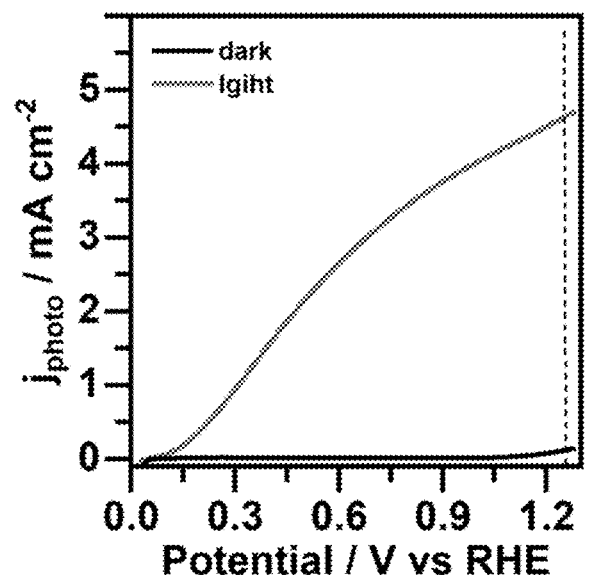
FIG. 5B is an LSV graph of BiVO$_4$/WO$_3$ recorded in the presence of hole scavenger (0.5 M Na$_2$SO$_3$) in 0.5 M PBS, according to certain embodiments.
Figure 5C:
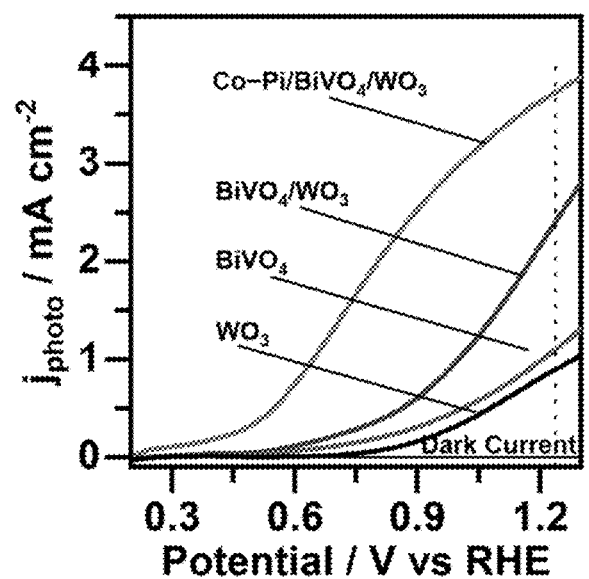
FIG. 5C is an overlay of LSV graphs of WO$_3$, BiVO$_4$, BiVO$_4$/WO$_3$, and Co-Pi modified BiVO$_4$/WO$_3$ photoelectrodes, according to certain embodiments.

In one embodiment, the $WO_3$ film has a uniform sheet-like morphology as depicted in FIG. 4A. In a preferred embodiment, the $WO_3$ film has an average thickness of 50 to 250 nanometers (nm), preferably 75 to 225 nm, preferably 100 to 200 nm, preferably 125 to 175 nm, or even more preferably about 150 nm. In a further preferred embodiment, the $WO_3$ film has a photocurrent density of 0.5 to 1 milliamperes per square centimeter ($mA\ cm^{-2}$), preferably 0.85 $mA\ cm^{-2}$ at 1.23 $V_{RHE}$, as depicted in FIG. 5C. Other ranges are also possible.

At step 104, the method 100 includes direct current reactive sputtering bismuth (Bi) onto the tungsten trioxide ($WO_3$) film in a gaseous mixture comprising oxygen to form a dibismuth trioxide ($Bi_2O_3$) film on the $WO_3$ film. In some embodiments, a metallic bismuth (Bi) disk is used as a sputtering target to deposit the $Bi_2O_3$ film on a surface of the $WO_3$ film. In another embodiment, the $Bi_2O_3$ film formed through DC sputtering covers at least 25%, at least 50%, at least 75%, at least 95%, or at least 99.5% of the surface of the $WO_3$ film. Other ranges are also possible.

In some embodiments, the DC reactive sputtering of Bi is carried out in a chamber at a working pressure of $1\times10^{-3}$ to $10\times10^{-3}$ torr, preferably $1.5\times10^{-3}$ to $5\times10^{-3}$ torr, preferably $2\times10^{-3}$ to $4\times10^{-3}$ torr, or even preferably about $3\times10^{-3}$ torr. In some embodiments, the $WO_3$ film used to sputter Bi has an average thickness of 50 to 250 nm, preferably 75 to 225 nm, preferably 100 to 200 nm, preferably 125 to 175 nm, or even more preferably about 150 nm. In some embodiments, direct current reactive sputtering Bi onto the $WO_3$ film is carried out at a power of 5 to 50 W, preferably 10 to 45 W, preferably 20 to 40 W, or even preferably 30 W for a time duration of 1 to 30 minutes, preferably 1 to 15 minutes in the presence of the gaseous mixture comprising oxygen. In still some other embodiments, the gaseous mixture is introduced on to the $WO_3$ film at a flow rate of 10 to 70 sccm, preferably 30 to 50 sccm, or even preferably about 40 sccm. In yet some other embodiments, the gases mixture may further include argon, neon, krypton, and xenon. In some preferred embodiments, the gases mixture comprises oxygen and argon, in which a volume ratio of oxygen gas to argon gas is in a range of 1:10 to 10:1, preferably 1:5 to 5:1, preferably 1:2 to 2:1, or even preferably 1:1. Other ranges are also possible.

As used herein, the term "interparticle porosity" generally refers to a porous network created by multiple molecules or particles and wherein the pores are formed by the space between physically aggregated particles or molecules.

In some embodiments, the $Bi_2O_3$ film has an interparticle porosity structure. In some embodiments, the $Bi_2O_3$ film has an average pore size of 0.01 to 1 µm, preferably 0.05 to 0.8 µm, preferably 0.1 to 0.6 µm, or even more preferably 0.15 to 0.4 µm. In some preferred embodiments, the $Bi_2O_3$ film is uniformly deposited on the surface of the $WO_3$ film.

As used herein, the term "drop-casting" or "drop-cast" or similar terms generally refer to the formation of a thin solid film by dropping a solution onto a flat surface followed by evaporation of the solution.

At step 106, the method 100 includes drop-casting a vanadyl acetylacetonate solution onto the $Bi_2O_3$ film and heating at a temperature of at least 450° C. in ambient air to convert the $Bi_2O_3$ film to a $BiVO_4$ film. In one embodiment, the vanadyl acetylacetonate solution has a concentration in a range of 0.01 to 0.3 M in dimethylsulfoxide (DMSO), preferably 0.05 to 0.25 M, preferably 0.1 to 0.2 M, or even more preferably about 0.15 M in DMSO. In some preferred embodiments, the $Bi_2O_3$ film after drop-casting is further heated at a temperature of at least 400° C., at least 450° C., at least 500° C. in ambient air for a time duration of 1 to 3 hours, or preferably about 2 hours with a heating ramp rate of 0.5 to 5° C./min, preferably 1 to 4° C./min, 1.5 to 3° C./min, or even more preferably about 2° C./min. In still some other embodiments, the $BiVO_4$ film after heating may be further treated with an alkali solution for at least 15 minutes, at least 20 minutes, or at least 30 minutes to remove by product $V_2O_5$ formed during drop-casting. In some embodiments, the alkali solution is selected from the group consisting of sodium hydroxide solution, potassium hydroxide solution, calcium hydroxide solution, sodium carbonate solution, sodium hydrogen carbonate solution and potassium carbonate solution at a concentration of 0.1 to 2 M, preferably 0.5 to 1.5 M, or preferably about 1M. Other ranges are also possible. In some embodiments, the $BiVO_4$ film is a porous film comprising crystalline $BiVO_4$, as depicted in FIG. 4C. In some embodiments, the $BiVO_4$ film has a crystallinity ranging from at least 1% by weight, at least 30%, at least 60, at least 90%, or at least 99.5%, based on a total weight of the $BiVO_4$ film. In some preferred embodiments, the $BiVO_4$ film has an average pore size of 0.01 to 1 µm, preferably 0.05 to 0.8 µm, preferably 0.1 to 0.6 µm, or even more preferably 0.15 to 0.4 µm. In still some other embodiments, the $BiVO_4$ film has an average thickness of 100 to 600 nm, preferably 150 to 550 nm, preferably 200 to 500 nm, preferably 250 to 450 nm, preferably 300 to 400 nm. In some further preferred embodiment, 70-100%, more preferably 80-99%, even more preferably 85-97% of the surface of the substrate is covered with $BiVO_4$ particles, though in some embodiments, less than 70% of the surface of the substrate is covered with the $BiVO_4$ particles. In yet some other embodiments, the $BiVO_4$ film has a photocurrent density of 0.8 to 1.5 $mA\ cm^{-2}$ at 1.23 $V_{RHE}$, preferably 0.85 to 1.3 $mA\ cm^{-2}$, preferably 0.9 to 1.1 $mA\ cm_{-2}$, or even more preferably about 1.0 $mA\ cm^{-2}$ at 1.23 $V_{RHE}$. Other ranges are also possible.

A co-catalyst cobalt-phosphate (Co-Pi) is used to modify the surface of the $BiVO_4$ and $WO_3$ film for the purpose of minimizing substrate surface electron-hole recombination process. The deposition of Co-Pi particles onto the surface of the $BiVO_4$ and $WO_3$ film coated substrate can tune the charge decay and charge transport along the surface and thus accelerate water oxidation. The Co-Pi particles may be deposited onto the conducting substrate via various techniques known by those of ordinary skill in the art including, without limitation, Langmuir-Blodgett technique, chemical vapor deposition, atomic layer deposition, electrochemical solution deposition, spin coating or spraying, sputter deposition, cathodic arc deposition, pulsed laser deposition, lithography, and thermal evaporation method. The electrochemical solution deposition has been used to form particles on the surface of the $BiVO_4$ and $WO_3$ film coated substrate.

At step 108, the method 100 includes immersing the $BiVO_4$ film on the substrate in an aqueous mixture containing a cobalt salt and a phosphate salt. In some embodiments, the cobalt salt is at least one selected from the group consisting of cobalt sulfide, cobalt fluoride, cobalt naphthenate, cobalt acetate, cobalt monoantimonide, cobalt oxide, cobalt triantimonide, cobalt hydroxide, cobalt chloride, cobalt thiocyanate, cobalt acetylacetonate, cobalt sulfate, cobalt carbonyl, cobalt nitrate, cobalt bromide, a hydrate thereof, or a mixture thereof. In a more preferred embodiment, the cobalt is cobalt nitrate. In some embodiments, the cobalt salt is present in the aqueous solution at a concentration of 0.05 to 5 mM, preferably 0.1 to 2 mM, preferably 0.1 to 1 mM, or even more preferably about 0.5 mM. Other ranges are also possible.

In some further embodiments, the phosphate salt is at least one selected from the group consisting of sodium phosphate, sodium phosphate dibasic, sodium phosphate monobasic, potassium phosphate, potassium phosphate dibasic, potassium phosphate monobasic, a hydrate thereof, or a mixture thereof. In a more preferred embodiment, the phosphate salt includes sodium phosphate dibasic, sodium phosphate monobasic, or a mixture of the two in any suitable proportion. In some embodiments, the phosphate salt is present in the aqueous solution at a concentration of 0.01 to 1 M, preferably from 0.05 to 0.5 M, preferably from 0.08 to 0.2 M, or even more preferably about 0.1 M. Other ranges are also possible.

At step 108, the method 100 further involves mixing at least one cobalt (Co) salt and at least one phosphate (Pi) salt in a liquid to form the aqueous mixture having a pH value ranging from 5.5 to 7.5, preferably from 6.0 to 7.3, preferably from 6.5 to 7.1, or even preferably about 7.0. In some embodiment, the liquid is water. In some further embodiments, a molar ratio of Co to Pi is in a range of 1:50 to 1:400, preferably 1:100 to 1:350, preferably 1:150 to 1:300, or even more preferably 1:200.

At step 110, the method 100 includes photoelectrochemically coating the $BiVO_4$ film with a cobalt-phosphate (Co-Pi) to form a modified film on the surface of the substrate. In some embodiments, the Co-Pi modified $BiVO_4/WO_3$ heterostructure film is uniform and pinhole-free. In some preferred embodiments, the Co-Pi modified $BiVO_4/WO_3$ heterostructure film contains a plurality of Co-Pi particles uniformly distributed on the modified film. In some embodiments, the Co-Pi particles have an average particle size of 20 to 200 nm, preferably 40 to 180 nm, preferably 60 to 160 nm, preferably 80 to 140 nm, or even more preferably 100 to 12 nm.

In some embodiments, the Co-Pi modified $BiVO_4/WO_3$ heterostructure film has a thickness in a range of 150 to 850 nm, preferably 250 to 750 nm, preferably 350 nm to 650 nm, preferably 450 to 550 nm, or even more preferably about 500 nm.

In some embodiments, the Co-Pi modified $BiVO_4/WO_3$ heterostructure film has a photocurrent density of 2.5 to 5.0 mA cm$^{-2}$ at 1.23 $V_{RHE}$, preferably 3.0 to 4.5 mA cm$^{-2}$, preferably 3.5 to 4.0 mA cm$^{-2}$, or even more preferably about 3.7 mA cm$^{-2}$ at 1.23 $V_{RHE}$.

The crystalline structure of the $WO_3$, $BiVO_4$, and $BiVO_4/WO_3$ films is characterized by X-ray diffraction (XRD). In some embodiments, the XRD patterns are collected in a Rigaku Miniflex 600 X-ray diffractometer equipped with a Cu-Kα radiation source (λ=1.5406 Å) for a 2θ range extending between 10 and 80°, preferably 20 and 70°, further preferably 30 and 60° at an angular rate of 0.005 to 0.04° s$^{-1}$, preferably 0.01 to 0.03° s$^{-1}$, or even preferably 0.02° s$^{-1}$.

In some embodiments, the $WO_3$ film has peaks with a 2θ value of about 23.5°, about 24.0°, about 24.7°, about 29.2°, about 34.1°, about 34.7°, about 42.1°, about 50.1°, and about 56.2° in the XRD spectrum, as depicted in FIG. 1. In some further embodiments, the $BiVO_4$ film has peaks with a 2θ value of about 19.6°, about 29.7°, about 31.4°, about 35.4°, about 36.0°, about 40.8°, about 43.4°, about 46.8°, about 47.7°, and about 54.3°, as depicted in FIG. 1. In yet some other embodiments, pattern peaks in the XRD spectrum of the $BiVO_4/WO_3$ film confirm the presence of both $BiVO_4$ and $WO_3$ structures. Other ranges are also possible.

Exemplary substrates include fluorine doped tin oxide (FTO) film, indium tin oxide (ITO) film, ITO coated polyethylene terephthalate (PET) film, a gold film, gold coated glass, aluminum oxide, titanium oxide, nickel oxide, tungsten oxide, strontium titanate, quartz, and silicon wafer. In a preferred embodiment, the conducting substrate is selected from the group consisting of FTO (fluorine-doped tin oxide), ITO (indium tin oxide), AZO (aluminum-doped zinc oxide), GZO (gallium-doped zinc oxide), IZO (indium zinc oxide), IZTO (indium zinc tin oxide), IAZO (indium aluminum zinc oxide), IGZO (indium gallium zinc oxide), IGTO (indium gallium tin oxide), and ATO (antimony tin oxide). In a most preferred embodiment, the conducting substrate is fluorine doped tin oxide.

The photoelectrochemically coating at step 110 further involve (i) adding the aqueous mixture containing a cobalt-phosphate (Co-Pi) to a photoelectrochemical cell connected to a power supply, (ii) at least partially immersing the substate coated with the $BiVO_4$ film in the aqueous mixture, (ii) applying a potential to the aqueous mixture via the substrate to form a plurality of cobalt-phosphate (Co-Pi) particles on the surface of the $BiVO_4$ film, and (iv) removing the substrate from the aqueous mixture and drying to form the modified film on the surface of the substrate.

In accordance with the present disclosure, a photoelectrochemical cell comprises the $BiVO_4$ and $WO_3$ film coated substrate, a counter electrode, and an electrolyte solution containing water and an inorganic salt in contact with both the $BiVO_4$ and $WO_3$ film coated substrate and the counter electrode. As used herein, the $BiVO_4$ and $WO_3$ film coated substrate may be considered as a working electrode in the photoelectrochemical cell.

In one embodiment, the photoelectrochemical cell is a vessel having an internal cavity for holding the electrolyte solution. The vessel may be cylindrical, cuboid, frustoconical, spherical, or some other shape. The vessel walls may comprise a material including, but not limited to, glass, quartz, polypropylene, polyvinyl chloride, polyethylene, and/or polytetrafluoroethylene. In a preferred embodiment, a vessel with a transparent window is used. For example, the window may comprise glass or quartz, though in one embodiment, a polymeric material transparent to visible light and chemically stable with the reaction mixture may be used. As defined herein, "transparent" refers to an optical quality of a compound wherein a certain wavelength or range of wavelengths of light may traverse through a portion of the compound with a small loss of light intensity. Here, the "transparent window" may cause a loss of less than 10%, preferably less than 5%, more preferably less than 2% of the intensity of a certain wavelength or range of wavelengths of light. In one embodiment, the vessel wall and window may comprise the same material, for example, a vessel may comprise quartz walls, which may also function as transparent windows. The internal cavity may have a volume of 2-100 mL, preferably 2.5-50 mL, more preferably 3-20 mL. In another embodiment, the internal cavity may have a volume of 100 mL-50 L, preferably 1-20 L, more preferably 2-10 L. In another embodiment, for instance, for pilot plant testing, the internal cavity may have a volume of 50-10,000 L, preferably 70-1,000 L, more preferably 80-2,000 L. In another embodiment, the internal cavity may have a volume larger than 2,000 L. In one embodiment, one or more photoelectrochemical cells may be connected to each other in parallel and/or in series. In another embodiment, the electrolyte solution may be in contact with more than one working electrode and/or more than one counter electrode. Other ranges are also possible.

In one embodiment, the counter electrode comprises platinum, gold, silver, or carbon. In a preferred embodiment, the counter electrode comprises platinum. In one embodiment, the counter electrode may be in the form of a wire, a rod, a cylinder, a tube, a scroll, a sheet, a piece of foil, a woven mesh, a perforated sheet, or a brush. The counter electrode may be polished in order to reduce surface roughness or may be texturized with grooves, channels, divots, microstructures, or nanostructures. In at least one embodiment, where the counter electrode comprises platinum, the counter electrode is in the form of a wire. In some embodiments, the counter electrode may comprise some other electrically conductive material such as gold, platinum-iridium alloy, iridium, titanium, titanium alloy, stainless steel, and cobalt alloy. As defined herein, an "electrically-conductive material" is a substance with an electrical resistivity of at most $10^{-6}$ Ω·m, preferably at most $10^{-7}$ Ω·m, more preferably at most $10^{-8}$ Ω·m at a temperature of 20-25° C. In a preferred embodiment, the counter electrode has at least one outer surface comprising an essentially inert, electrically conducting material, such as platinum, gold, silver, or carbon. In another preferred embodiment, the counter electrode may comprise solid platinum, gold, or carbon. The material of the counter electrode should be sufficiently inert to withstand the chemical conditions in the electrolyte solution without substantially degrading during a photoelectrochemical reaction.

In one embodiment, the electrolyte solution has an inorganic salt concentration of 0.05-1 M, preferably 0.1-0.8 M, preferably 0.2-0.7 M, preferably 0.4-0.6 M, or about 0.5 M, though in some embodiments, the inorganic salt may be present at a concentration less than 0.05 M or greater than 1 M. The inorganic salt may be $Na_2SO_4$, $K_2SO_4$, $ZnSO_4$, LiCl, NaCl, KCl, $NaClO_4$, $KNO_3$, $NaNO_3$, $NH_4Cl$, $NH_4NO_3$, $LiPF_6$, $MgCl_2$, or some other inorganic salt. Preferably the inorganic salt is $Na_2SO_4$. In an alternative embodiment, an inorganic acid such as HCl, $HClO_4$, $HNO_3$, or $H_2SO_4$ may be used in addition to, or in lieu of the inorganic salt. In another alternative embodiment, an inorganic base such as LiOH, NaOH, KOH, or $NH_3$ may be used in addition to, or in lieu of the inorganic salt. In one or more embodiments, the electrolyte solution has a pH in a range of 5-9, preferably 6-8, more preferably a pH at about 7. In an alternative embodiment, the electrolyte solution has a pH less than 5 or greater than 9.

In one embodiment, the photoelectrochemical cell further comprises a reference electrode in contact with the electrolyte solution. A reference electrode is an electrode which has a stable and well-defined electrode potential. The high stability of the electrode potential is usually reached by employing a redox system with constant (buffered or saturated) concentrations of each relevant species of the redox reaction. A reference electrode may enable a potentiostat to deliver a stable voltage to the working electrode or the counter electrode. The reference electrode may be a saturated calomel electrode (SCE), a standard hydrogen electrode (SHE), a normal hydrogen electrode (NHE), a reversible hydrogen electrode (RHE), a copper-copper(II) sulfate electrode (CSE), a silver chloride electrode (Ag/AgCl), a pH-electrode, a palladium-hydrogen electrode, a dynamic hydrogen electrode (DHE), a mercury-mercurous sulfate electrode, or some other type of electrode. In a preferred embodiment, a reference electrode is present and is a silver chloride electrode (Ag/AgCl). However, in certain embodiments, the photoelectrochemical cell does not comprise a reference electrode.

In some embodiments, the substate coated with the $BiVO_4$ film is at least 10%, at least 30%, at least 50%, at least 70%, at least 90%, or at least 99% immersed in the aqueous mixture, based on the total surface area of the substrate. Other ranges are also possible.

In some embodiments, the potential applied to the aqueous mixture via the substrate ranges from 0.01 to 1 $V_{RHE}$, preferably from 0.05 to 0.8 $V_{RHE}$, preferably from 0.1 to 0.4 $V_{RHE}$ for a time duration of 5 to 360 seconds, preferably 10 to 180 seconds, preferably 30 to 120 seconds at ambient temperature. Other ranges are also possible.

According to a second aspect, the present invention relates to a method for water oxidation using a photoanode containing the Co-Pi modified $BiVO_4/WO_3$ heterostructure film. In some embodiment, the photoanode comprising the Co-Pi modified $BiVO_4/WO_3$ heterostructure film is prepared by method 100 on a substrate. In some further embodiments, the photoanode is fabricated on a fluorinated tin oxide (FTO) glass as the substrate.

In some embodiments, the Co-Pi modified $BiVO_4/WO_3$ heterostructure film coated photoanode has a photocurrent density of 2 to 5 mA cm$^{-2}$ at a potential of 1.23 $V_{RHE}$, preferably 2.5 to 4.5 mA cm$^{-2}$, preferably 3 to 4 mA cm$^{-2}$, or even preferably about 3.7 at 1.23 $V_{RHE}$, as depicted in FIG. 5C. In some further embodiment, the photocurrent generated by the Co-Pi modified $BiVO_4/WO_3$ heterostructure film coated photoanode is at least 15%, at least 30%, at least 45%, at least 60%, at least 75% higher than the photocurrent generated by the $BiVO_4/WO_3$ heterostructure film coated photoanode without Co-Pi modification at a potential of 1.23 $V_{RHE}$. In yet still other embodiments, the photocurrent generated by the Co-Pi modified $BiVO_4/WO_3$ heterostructure film coated photoanode is at least 150%, at least 200%, at least 250%, at least 300% higher than the photocurrent generated by either a bare $BiVO_4$ film coated photoanode or a bare $WO_3$ film coated photoanode at a potential of 1.23 $V_{RHE}$. Other ranges are also possible.

Figure 5D:
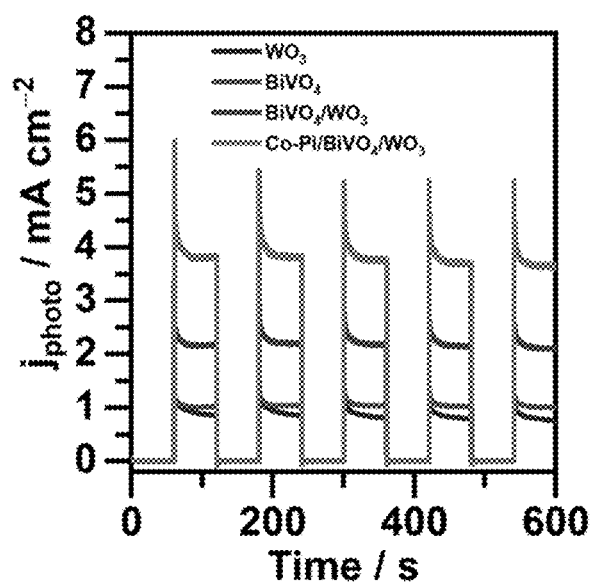
FIG. 5D is an overlay of chronoamperometry curves of WO$_3$, BiVO$_4$, BiVO$_4$/WO$_3$, and Co-Pi modified BiVO$_4$/WO$_3$ photoelectrodes under intermittent illumination for 600 s, according to certain embodiments.
Figure 5E:
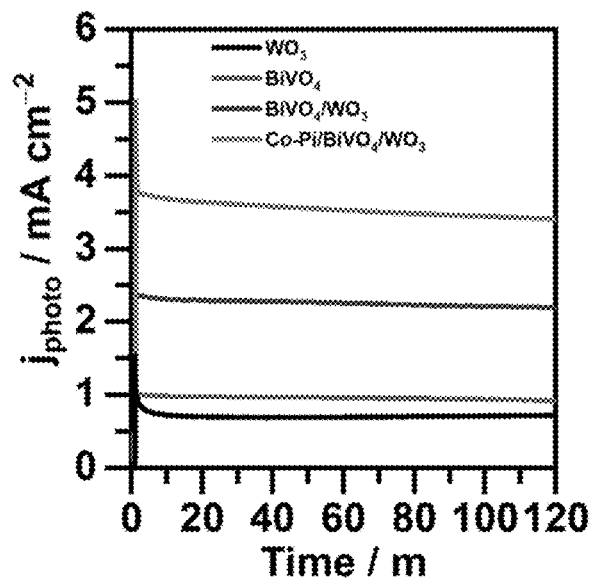
FIG. 5E is an overlay of stability curves of Co-Pi modified BiVO$_4$/WO$_3$, BiVO$_4$/WO$_3$, BiVO$_4$, and WO$_3$ photoelectrodes under standard illumination for 2 hours, according to certain embodiments.
Figure 5F:
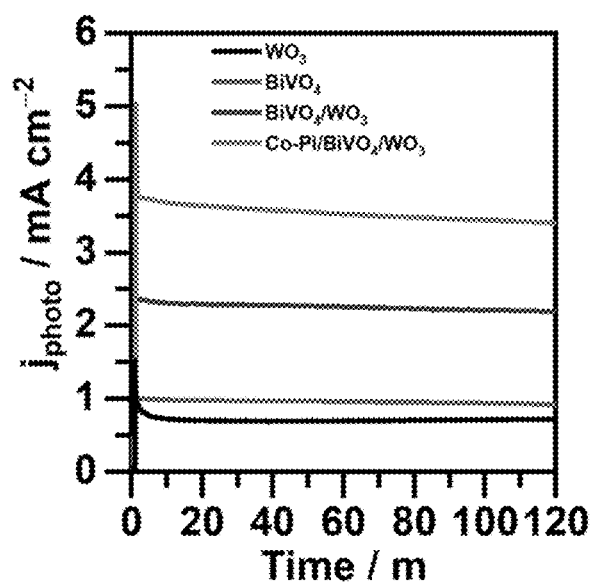
FIG. 5F illustrates an overlay of incident photon-to-current conversion efficiency (IPCE) spectra of Co-Pi modified BiVO$_4$/WO$_3$, BiVO$_4$/WO$_3$, BiVO$_4$, and WO$_3$ photoelectrodes under different collimated LED light illumination, according to certain embodiments.

In some embodiments, the Co-Pi modified $BiVO_4/WO_3$ heterostructure film coated photoanode has an incident photon-to-current conversion efficiency (IPCE) up to 20%, 25%, 30%, 35%, or 40% at 430 nm wavelength, as depicted in FIG. 5F.

Figure 7A:
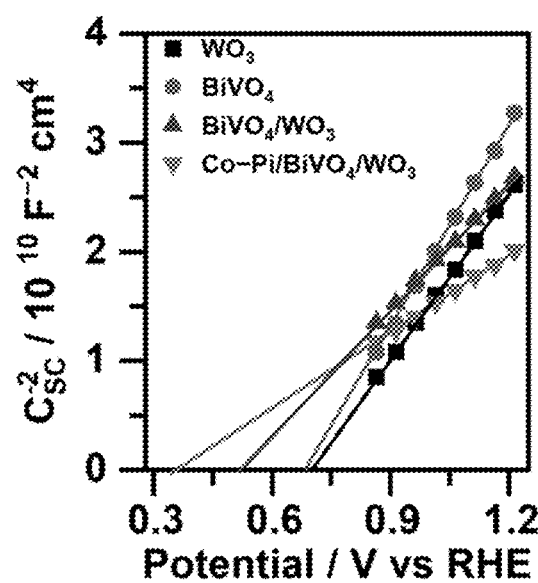
FIG. 7A is an overlay of Mott-Schottky (M-S) plots of Co-Pi modified $BiVO_4/WO_3$, $BiVO_4/WO_3$, $BiVO_4$, and $WO_3$ photoanodes under standard illumination conditions, according to certain embodiments.

Referring to FIG. 7A, an overlay of Mott-Schottky (M-S) plots of Co-Pi/$BiVO_4/WO_3$, $BiVO_4/WO_3$, $BiVO_4$, and $WO_3$ photoanodes under standard illumination condition. The Mott-Schottky can be used to determine the flat-band potential ($Et^{fb}$) and carrier density ($N^d$) for the fabricated photoanodes. Moreover, the flat-band potential ($Et^{fb}$) of photoanodes is calculated by extrapolating the linear part of the M-S curve to the potential axis. In some embodiments, the $E^{fb}$ of Co-Pi/$BiVO_4/WO_3$ coated photoanode and $BiVO_4/WO_3$ coated photoanode shifts upward in the Fermi level, resulting in enhanced charge carrier separation of the photoanode. In some further embodiments, the Co-Pi modified $BiVO_4/WO_3$ heterostructure film coated photoanode has a flat-band potential in a range of 0.1 to 0.7 $V_{RHE}$, preferably 0.2 to 0.6 $V_{RHE}$, preferably 0.3 to 0.4 $V_{RHE}$, or more preferably 0.35 $V_{RHE}$. Other ranges are also possible.

In accordance with the second aspect, the method for water oxidation using a photoanode containing the Co-Pi modified $BiVO_4/WO_3$ heterostructure film further includes irradiating the substrate coated by the modified film and water in a photoelectrochemical cell with electromagnetic radiation to form hydrogen and oxygen. In one embodiment, the substrate is a fluorinated tin oxide (FTO) glass. In a preferred embodiment, the electromagnetic radiation is selected from the group consisting of gamma rays, X-rays, ultraviolet radiation, visible light, infrared radiation, and radio waves. In a further preferred embodiment, the electromagnetic radiation further comprises sunlight. In certain embodiments, electromagnetic radiation may be performed by a light source internal or external to the photoelectrochemical cell and may provide the photon energy necessary to activate the photocatalytic material of the photoelectrochemical cell in any of its embodiments. The light source may be any known light source including, but not limited to, natural solar sunlight, simulated solar light, UV light, laser light, incandescent light, and the like. Exemplary light sources include, but are not limited to, a xenon lamp such as a xenon arc lamp and a xenon flash lamp, a mercurial lamp, a metal halide lamp, an LED lamp, a solar simulator, and a halogen lamp. In certain embodiments, two or more light sources may be used. In a preferred embodiment, a simulated solar light may be used as the light source. In another preferred embodiment, natural sunlight may be used as the light source. The light may have a wavelength of 300-800 nm, 350-700 nm, preferably 400-600 nm, more preferably 410-450 nm. The light source may comprise one or more wavelengths within the range of 300-800 nm. Preferably a light source is used which emits a broad wavelength range of light and which comprises a portion or the entire ultraviolet and visible light spectrum. A light source may additionally emit light of wavelengths below 300 nm and/or above 800 nm. In one embodiment, a filter may be used to prevent UV light from entering the reaction mixture, for example, a filter that blocks light with wavelengths less than 300 nm may be used with a simulated solar light, xenon, or a mercury gas discharge lamp. Alternatively, a light source may be used which only emits light within the ultraviolet and/or visible spectrum. The light source may emit a total power of 50-2,000 W, preferably 100-1,500 W, more preferably 300-1,000 W, and may be positioned 2-30 cm, preferably 5-20 cm, more preferably 8-15 cm from the closest surface of the $BiVO_4$ photoelectrode. In a preferred embodiment, the light source has an intensity of 500-4000 $W/m^2$, preferably 700-2000 $W/m^2$, more preferably 900-1500 $W/m^2$, or about 1000 $W/m^2$ (100 $mW/cm^2$, 1 SUN power). Other ranges are also possible.

Figure 10:
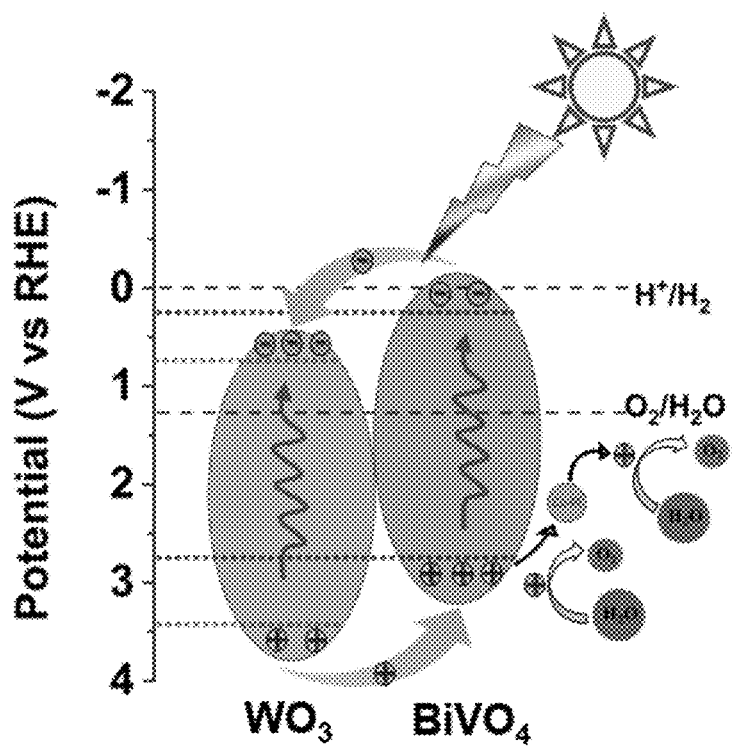
FIG. 10 is a graph depicting plausible routes of charge transfer in the Co-Pi modified $BiVO_4/WO_3$ photoanode for water oxidation process.

Additionally, the method for water oxidation using a photoanode containing the Co-Pi modified $BiVO_4/WO_3$ heterostructure film further involves subjecting the photoelectrochemical cell of the second aspect to a bias potential of 0.5-3 V, preferably 0.6-1.8 V, preferably 0.7-1.6 V, preferably 0.8-1.4 V, preferably 0.9-1.3 V, preferably 1-1.2 V, and concurrently irradiating the photoelectrochemical cell with visible light, thereby forming $H_2$ and $O_2$. In some embodiments, the photoelectrochemical cell is subjected to a potential less than 0.5 V or greater than 3.0 V, as depicted in FIG. 10.

Photoelectrochemical water splitting dissociates water into its constituent parts, hydrogen ($H_2$) and oxygen ($O_2$), by applying a potential to a photoelectrochemical cell under either artificial or natural light. The process generally involves a photoelectrocatalyst absorbing a photon with sufficient energy (above 1.23 eV, $\lambda < \sim 1000$ nm), subsequently permitting photoexcited electrons and holes to separate and migrate to the surface of the photoelectrocatalyst material, reducing adsorbed species (i.e. water). Photo-assisted water splitting processes involve the interaction of light with the valence band electrons of the photoelectrocatalyst material, which get excited to the conduction band by absorbing the photon and leave the electron vacancy ("positive hole") in place. These electron-hole pairs contribute to water reduction and oxidation.

Irradiating the photoelectrochemical cell with visible light during water splitting may be performed by the aforementioned light source internal or external to the photoelectrochemical cell. The light source may comprise one or more wavelengths within the range of 300-800 nm. The light source may additionally emit light of wavelengths below 300 nm and/or above 800 nm. For example, a simulated solar light may be used as the light source. For another example, natural sunlight may be used as the light source. The light source may emit a total power of 50-2000 W, preferably 100-1500 W, more preferably 300-1000 W.

In one embodiment, the aforementioned method of splitting water into hydrogen gas and oxygen gas involves subjecting the photoelectrochemical cell to a bias potential of 0.1-3.0 V, preferably 0.25-2.0 V, preferably 0.4-1.5 V, preferably 0.6-1.25 V, preferably 0.8-1.0 V, and concurrently irradiating the photoelectrochemical cell with visible light for 0.1-24 hours, 0.5-18 hours, 1-12 hours, 2-11 hours, 3-10 hours, 4-9 hours, 5-8 hours, or 6-7 hours.

Preferably, the counter electrode (e.g., the platinum wire) functions as the photocathode by receiving a negative potential to reduce water into $H_2$ gas and $OH^-$, while the Co-Pi modified $BiVO_4/WO_3$ heterostructure film coated photoelectrode functions as the photoanode by receiving a positive potential to oxidize $OH^-$ into $O_2$ gas and $H_2O$.

In one embodiment, the method further comprises a step of separately collecting $H_2$-enriched gas and $O_2$-enriched gas. In one embodiment, the space above each electrode may be confined to a vessel in order to receive or store the produced gases from one or both electrodes. The collected gas may be further processed, filtered, or compressed. Preferably the $H_2$-enriched gas is collected above the photocathode, and the $O_2$-enriched gas is collected above the photoanode. In one embodiment, the Hz-enriched gas and the $O_2$-enriched gas are not 100 vol % $H_2$ and 100 vol % $O_2$, respectively. For example, the enriched gas may also comprise $N_2$ from air, and water vapor and other dissolved gases from the electrolyte solution. The $H_2$-enriched gas may also comprise $O_2$ from air. The $H_2$-enriched gas may comprise greater than 20 vol % $H_2$, preferably greater than 40 vol % $H_2$, more preferably greater than 60 vol % $H_2$, even more preferably greater than 80 vol % $H_2$, relative to a total volume of the receptacle collecting the produced $H_2$ gas. The $O_2$-enriched gas may comprise greater than 20 vol % $O_2$, preferably greater than 40 vol % $O_2$, more preferably greater than 60 vol % $O_2$, even more preferably greater than 80 vol % $O_2$, relative to a total volume of the receptacle collecting the produced $O_2$ gas. In some embodiments, the produced gases may be bubbled into a vessel comprising water or some other liquid, and a higher concentration of $H_2$ or $O_2$ may be collected. In one embodiment, produced $O_2$ and $H_2$, or $H_2$-enriched gas and $O_2$-enriched gas may be collected in the same vessel.

EXAMPLES

The following examples describe and demonstrate a method for coating a substrate with a Co-Pi modified $BiVO_4/WO_3$ heterostructure film. The examples are provided solely for illustration and are not to be construed as limitations of the present disclosure, as many variations thereof are possible without departing from the spirit and scope of the present disclosure.

Example 1: Fabrication of WO$_3$ Thin Film Photoanode

A direct current (DC) reactive sputtering system (model NSC-4000, Nanomaster, Austin, TX, USA) was used to fabricate WO$_3$ thin film photoanode. A metallic W disk (99.995% purity, purchased from ACI alloys INC, San Jose, CA, USA) was used as a sputtering target. First, F:SnO$_2$ (FTO) glasses with a dimension of 2×1 cm$^2$ were used as photoanode substrates. To eliminate surface contaminants from these substrates, they were first cleaned with soap, rinsed with DI water, and sonicated in DI water, acetone, ethanol, and finally in isopropanol for 15 minutes in each step and kept in isopropanol solution. Subsequently, the FTO substrates were placed 12 cm away from the sputtering target inside the sputtering chamber. A variety of deposition periods (1, 2.5, 5, 10, and 15 minutes) were applied to change the WO$_3$ films' thickness. The deposition chamber was evacuated to an initial pressure of 9×10$^{-6}$ Torr while maintaining the deposition pressure at 3×10$^{-3}$ Torr. For all samples, the deposition process was carried out in a 70 sccm mixture of oxygen and argon (35 sccm each) at a power output of 100 W. Finally, the fabricated WO$_3$ were annealed in ambient air for 2 hours using muffle furnace at 500° C. with 10°/min as ramping rate.

Example 2: Fabrication of BiVO$_4$/WO$_3$ Thin Film Photoanode

At a post-processing step, the BiVO$_4$ layer was placed on the WO$_3$ films. At a first stage, separate WO$_3$ films of varying thicknesses were deposited inside the deposition chamber. A circular disk of metallic Bi (99.995% purity; purchased from ACI alloys INC, San Jose, CA, USA) was utilized as a sputtering target to deposit a thin layer of Bi$_2$O$_3$ using a DC reactive sputtering system. The Bi$_2$O$_3$ layer was deposited using a 30 W deposition power and a 40 sccm mixture of oxygen and argon (20 sccm each). The initial and deposition pressures were kept consistent with those applied in the deposition of WO$_3$ thin films. Subsequently, 30 μL of vanadyl acetylacetonate solution (0.15 M in dimethylsulfoxide) was drop-cast on the surface of the Bi$_2$O$_3$/WO$_3$. The drop cast films were subsequently heat-treated for 2 hours at 450° C. with a 2°/min ramping rate in a muffle furnace. Finally, the extra V$_2$O$_5$ layer on the BiVO$_4$/WO$_3$ surface was removed by using 1.0 M NaOH for 20 min.

Example 3: Fabrication of Co-Pi/BiVO$_4$/WO$_3$ Thin Film Photoanode

The photo-assisted electrochemical deposition was used to deposit the Co-Pi on the surface of the BiVO$_4$/WO$_3$ film. The deposition was carried out in 0.5 mM solution of Co(NO$_3$)$_2$ in 0.1 M phosphate buffer (pH 7). Several potentials (0.1, 0.2, 0.3, and 0.4 V$_{RHE}$) and deposition times were used (30, 60, 90, and 120 sec) to optimize the amount of Co-Pi deposited on the BiVO$_4$/WO$_3$ film.

Example 4: Photoelectrochemical Measurements

All the PEC performance and characterizations were performed in a Teflon cell equipped with a quartz window on one side. The NOVA potentiostat PGSTAT 302N (equipped with FRA 32 M module) was used as an electrochemical workstation which is connected to a three-electrode system in 0.5 M phosphate buffer solution (PBS) as an electrolyte. The Pt and Ag/AgCl (3.0 M) electrodes were used as counter and reference electrodes, whereas bare WO$_3$ and modified photoanodes act as working electrodes with 0.25 cm$^2$ active area. The ABET solar simulator with AM 1.5 G filter was used for simulated light. The light intensity was calibrated to 100 mW cm$^{-2}$ by using Si photodiode.

The photocurrent density-potential (J-V) curves were measured by linear sweep voltammetry (LSV) with 50 mV s$^{-1}$. All the potentials were converted into reversible hydrogen electrode (RHE) by using Nernst Eqn. (1) as follows:

$$E_{RHE}=E_{Ag/AgCl}+E_{Ag/AgCl}^0+0.0591*pH \quad (1)$$

where $E_{Ag/AgCl}$ and $E_{Ag/AgCl}^0$ are applied potentials and standard reference electrode potentials (0.198 V). The incident photon-to-current conversion efficiency (IPCE) was measured at 1.23 V$_{RHE}$ by using collimated and high-power LEDs with specific wavelength ranging from (375-590 nm) and evaluated by using Eqn. (2).

$$IPCE\ \% = \frac{1240 J_{ph}}{\lambda P_{light}} \times 100 \quad (2)$$

The P$_{light}$ is the intensity of light (100 mW cm$_{-2}$) and J$_{ph}$ (mA cm$^{-2}$) was measured for Co-Pi/BiVO$_4$/WO$_3$, BiVO$_4$/WO$_3$, BiVO$_4$, and WO$_3$ photoanodes at 1.23 V$_{RHE}$. The light intensities were measured using calibrated Si photodiode. The Mott-Schottky (M-S) measurements were taken at different frequencies and presented at 1.0 kHz for Co-Pi/BiVO$_4$/WO$_3$, BiVO$_4$/WO$_3$, BiVO$_4$, and WO$_3$ photoanodes with different applied potentials in the dark.

The photoelectrochemical impedance spectroscopy (PEIS) was performed at various potentials with frequencies ranging from 100 kHz-0.1 Hz at 10 mV amplitude. For IMPS measurements, a sinusoidal intensity modulation and bias illumination from a 476 nm high-intensity triple LED was used with the frequency range from 10.0 kHz-0.1 Hz. The details of the setup are presented in the reference [Kandiel, T. A. Mechanistic investigation of water oxidation on hematite photoanodes using intensity-modulated photocurrent spectroscopy. *Journal of Photochemistry and Photobiology A: Chemistry* 2020, 403, 112825].

Example 5: Characterization

A variety of techniques were used to characterize the fabricated samples. The crystalline phase of the films was determined by X-ray diffraction (XRD, Cu K irradiation at =1.5406, Rigaku Miniflex 600 X-ray Diffraction, Tokyo, Japan). The optical characteristics and optical band gap of the films were evaluated using a UV-Vis spectrophotometer to determine their absorption of ultraviolet and visible light (Jasco V-570, Tokyo, Japan). The surface morphology and cross-sectional thickness of the film were examined using field emission scanning electron microscopy (FE-SEM Tescan Lyra-3, Brno-Kohoutovice, Czech Republic). The surface compositional properties of the films were determined using X-ray photoelectron spectroscopy (XPS) (XPS, Model: ESCALAB250Xi, Thermo Fisher, Waltham, MA, USA).

Example 6: Structural, Morphological, Optical, and Compositional Analyses

The structural properties of synthesized WO$_3$, BiVO$_4$, and BiVO$_4$/WO$_3$ electrodes were investigated by using X-ray diffraction (XRD), as shown in FIG. 1. The red circles indicate the diffraction patterns associated with the FTO substrate. The $WO_3$ films exhibit diffractions at 23.5°, 24.0°, 24.7°, 29.2°, 34.1°, 34.7°, 42.1°, 50.1°, and 56.2°, which correspond to (002), (020), (200), (112), (022), (202), (222), (400), and (124) planes, respectively. These diffractions are consistent with $WO_3$'s monoclinic structure phase (JCPDS No: 01-072-1465) [Mohite, S.; Rajpure, K. Oxidative degradation of salicylic acid by sprayed $WO_3$ photocatalyst. *Materials Science and Engineering*: B 2015, 200, 78-83.; Dongale, T.; Mohite, S.; Bagade, A.; Kamat, R.; Rajpure, K. Bio-mimicking the synaptic weights, analog memory, and forgetting effect using spray deposited $WO_3$ memristor device. *Microelectronic Engineering* 2017, 183, 12-18]. For the $BiVO_4$ film, the reflections at 19.6°, 29.7°, 31.4°, 35.4°, 36.0°, 40.8°, 43.4°, 46.8°, 47.7°, and 54.3° are attributed to the (011), (121), (040), (220), (141), (112), (051), (240), and (310) planes, respectively. This diffraction pattern matches with that of monoclinic $BiVO_4$ structure (JCPD No. 14-0688) [Tokunaga, S.; Kato, H.; Kudo, A. Selective preparation of monoclinic and tetragonal $BiVO_4$ with scheelite structure and their photocatalytic properties. *Chemistry of Materials* 2001, 13, 4624-4628], which is the preferable structural phase for $BiVO_4$ in photocatalytic application [Zeng, Q.; Li, J.; Li, L.; Bai, J.; Xia, L.; Zhou, B. Synthesis of $WO_3/BiVO_4$ photoanode using a reaction of bismuth nitrate with peroxovanadate on $WO_3$ film for efficient photoelectrocatalytic water splitting and organic pollutant degradation. *Applied Catalysis B: Environmental* 2017, 217, 21-29]. In the case of the $BiVO_4/WO_3$ bilayer film, the diffraction pattern reveals the presence of both $BiVO_4$ and $WO_3$ monoclinic structures. There were no additional reflections associated with the interaction of the two layers. Additionally, no evidence for the existence of Co-Pi was observed in the case of the Co-Pi/$BiVO_4/WO_3$ film as illustrated in the FIG. 1.

Figure 2A:
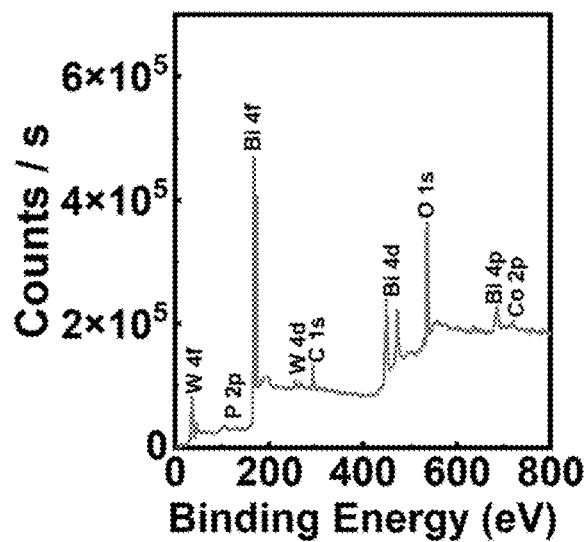
FIG. 2A illustrates an X-ray photoelectron spectroscopy (XPS) survey scan spectra of Co-Pi modified BiVO$_4$/WO$_3$, according to certain embodiments.
Figure 2B:
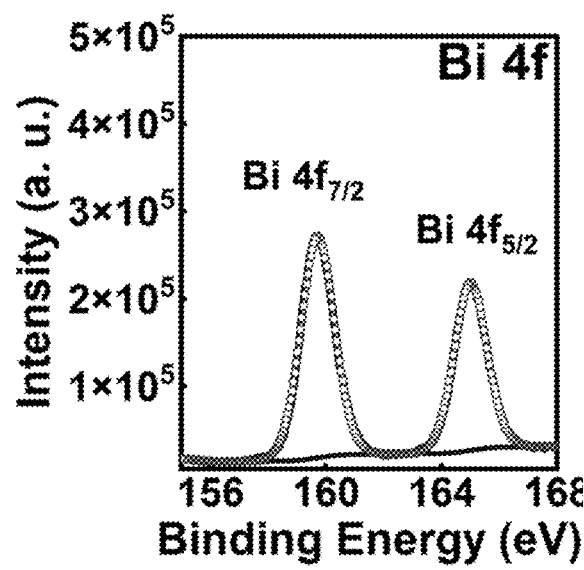
FIG. 2B illustrates a Bi 4f XPS spectra of Co-Pi modified BiVO$_4$/WO$_3$, according to certain embodiments.
Figure 2C:
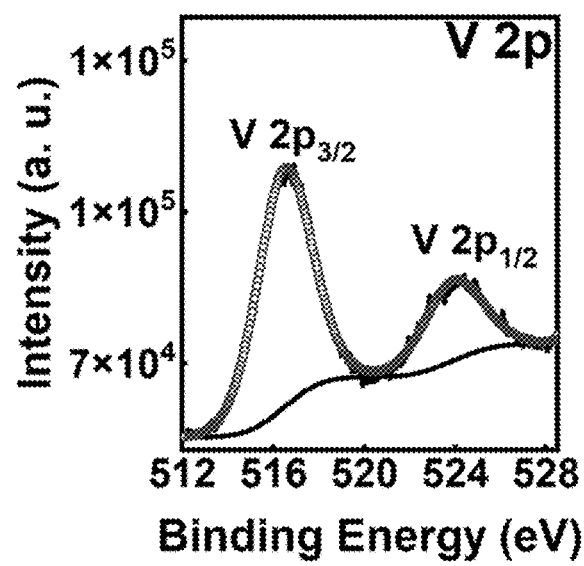
FIG. 2C illustrates a V 2p XPS spectra of Co-Pi modified BiVO$_4$/WO$_3$, according to certain embodiments.
Figure 2D:
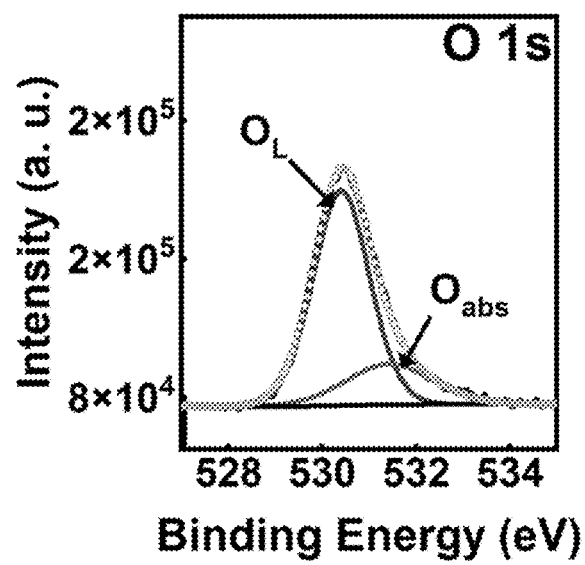
FIG. 2D illustrates an O 1s XPS spectra of Co-Pi modified BiVO$_4$/WO$_3$, according to certain embodiments.
Figure 2E:
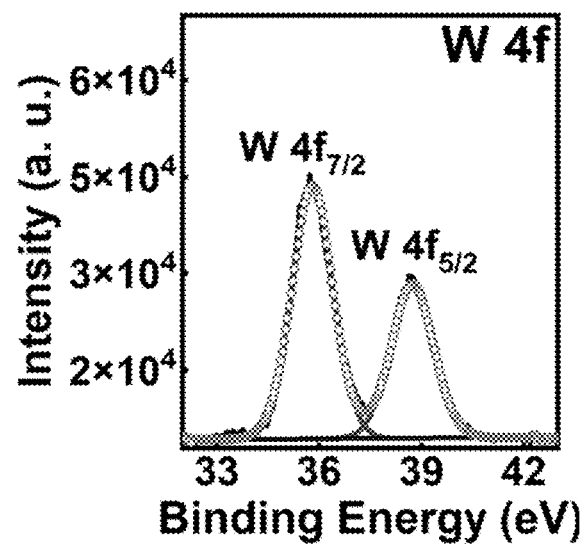
FIG. 2E illustrates a W 4f XPS spectra of Co-Pi modified BiVO$_4$/WO$_3$, according to certain embodiments.
Figure 2F:
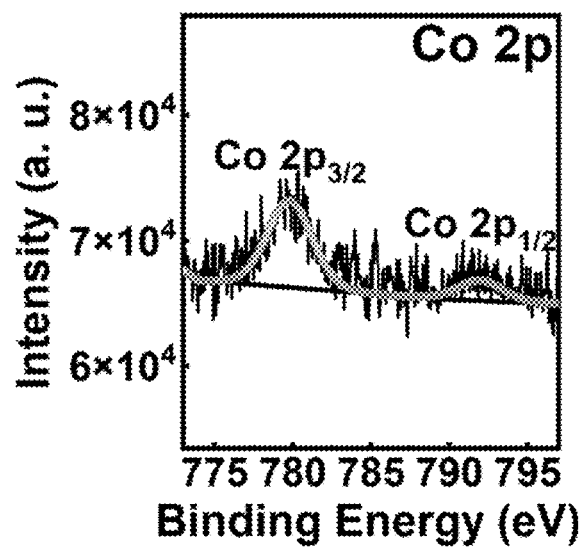
FIG. 2F illustrates a P 2p XPS spectra of Co-Pi modified BiVO$_4$/WO$_3$, according to certain embodiments.
Figure 2G:
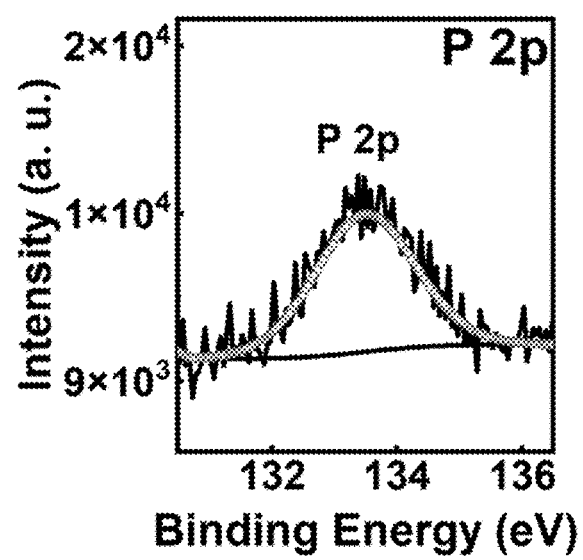
FIG. 2G illustrates a Co 2p XPS spectra of Co-Pi modified BiVO$_4$/WO$_3$, according to certain embodiments.

The compositional analysis of the fabricated Co-Pi/$BiVO_4/WO_3$ film was studied and confirmed the existence of the elements by using the X-ray photoelectron spectroscopy (XPS) as shown in the FIGS. 2A to 2G. To verify the purity of the fabricated film, a survey scan was performed at binding energies ranging from 0 to 800 eV, which confirmed the existence of W 4f, P 2p, Bi 4f, W 4d, C 1s, Bi 4d, O 1s, Bi 4p, and Co 2p in the spectra as exhibited in the FIG. 2A. The high resolution XPS spectra for Bi 4f was shown in the FIG. 2B. The presence of the Bi 4f doublet peaks at 159.7 eV (Bi $4f_{7/2}$) and 164.9 eV (Bi $4f_{5/2}$) binding energies was due to spin orbit coupling [Fang, G.; Liu, Z.; Han, C. Enhancing the PEC water splitting performance of $BiVO_4$ co-modifying with NiFeOOH and Co-Pi double layer cocatalysts. *Applied Surface Science* 2020, 515, 146095]. Additionally, the energies of these peaks indicate the existence of the bismuth valance state $Bi^{3+}$[Fang, G.; Liu, Z.; Han, C. Enhancing the PEC water splitting performance of $BiVO_4$ co-modifying with NiFeOOH and Co-Pi double layer cocatalysts. *Applied Surface Science* 2020, 515, 146095]. The XPS spectrum of V 2p is shown in FIG. 2C. V 2p doublet peaks at binding energies of 516.7 eV (V $2p_{3/2}$) and 524.2 eV (V $2p_{1/2}$) are associated with the vanadium valance state $V^{5+}$ [Fang, G.; Liu, Z.; Han, C. Enhancing the PEC water splitting performance of $BiVO_4$ co-modifying with NiFeOOH and Co-Pi double layer cocatalysts. *Applied Surface Science* 2020, 515, 146095]. FIG. 2D shows the deconvoluted peaks of high-resolution O 1s peaks. The O 1s peaks at 530.4 eV are associated with oxygen species bound within the lattice ($O_L$), whereas the other O 1s peak at 530.4 e is associated with oxygen species absorbed on the film's surface ($O_{abs}$) [Sánchez, O. A.; Rodríguez, J. L.; Barrera-Andrade, J. M.; Borja-Urby, R.; Valenzuela, M. A. High performance of Ag/BiVO4 photocatalyst for 2, 4-Dichlorophenoxyacetic acid degradation under visible light. *Applied Catalysis A: General* 2020, 600, 117625]. The XPS spectra of W 4f is displayed in FIG. 2E. The banding energies of W 4f doublet peaks are 35.6 eV (W $4f_{7/2}$) and 37.8 eV (W $4f_{5/2}$), which is corresponded to tungsten oxidation state $W^+$ [Wang, J.; Chen, Z.; Zhai, G.; Men, Y. Boosting photocatalytic activity of $WO_3$ nanorods with tailored surface oxygen vacancies for selective alcohol oxidations. *Applied Surface Science* 2018, 462, 760-771]. The presence of Co-Pi on the surface of the $BiVO_4/WO_3$ film is confirmed by the high resolution XPS spectra of P 2p and Co 2p shown in FIGS. 2F and 2G. P 2p's XPS peak was observed at a binding energy of 133.4 eV, whereas Co 2p's doublet XPS peak was observed at pending energies of 781.1 eV (Co $2p_{3/2}$) and 793.2 eV (Co $2p_{1/2}$) [Zhang, Y.; Wang, D.; Zhang, X.; Chen, Y.; Kong, L.; Chen, P.; Wang, Y.; Wang, C.; Wang, L.; Liu, Y. Enhanced photoelectrochemical performance of nanoporous $BiVO_4$ photoanode by combining surface deposited cobalt-phosphate with hydrogenation treatment. *Electrochimica Acta* 2016, 195, 51-58].

Figure 3A:
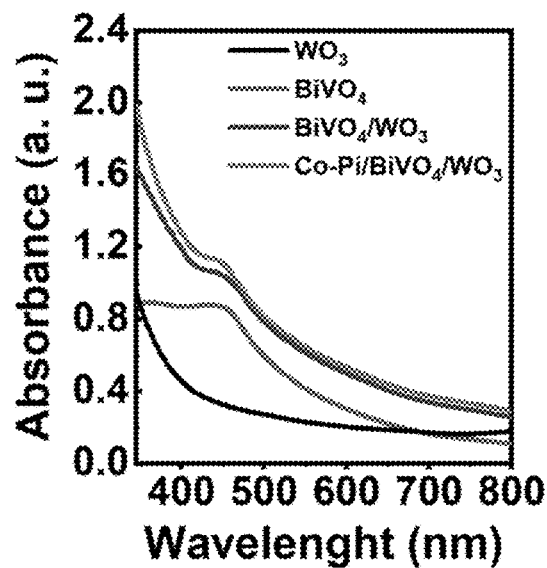
FIG. 3A illustrates an overlay of UV-Vis absorption spectra of WO$_3$, BiVO$_4$, BiVO$_4$/WO$_3$, and Co-Pi modified BiVO$_4$/WO$_3$ electrodes, according to certain embodiments.
Figure 3B:
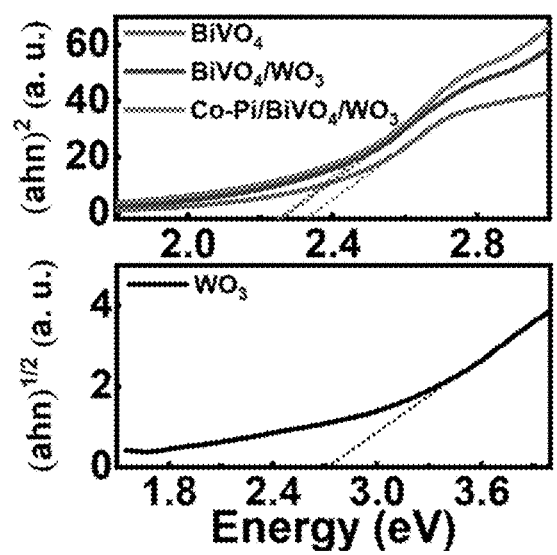
FIG. 3B illustrates the Tauc's plots of WO$_3$, BiVO$_4$, BiVO$_4$/WO$_3$, and Co-Pi modified BiVO$_4$/WO$_3$ electrodes, according to certain embodiments.

UV-Vis absorbance spectroscopy was employed to study the light-harvesting ability and optical band gap of the synthesized photoanode films (i.e., $WO_3$, $BiVO_4$, $BiVO_4/WO_3$, and Co-Pi/$BiVO_4/WO_3$) as shown in FIGS. 3A and 3B. The UV-Vis absorption results in FIG. 3A indicate that the $WO_3$ film has an absorption edge at approximately 455 nm (blue region). In contrast, the $BiVO_4$ film begins to absorb light at approximately 580 nm (yellow region). Deposition of the $BiVO_4$ layer on the surface of the $WO_3$ film shifted its absorption edge to 636 nm (red region). Moreover, it was observed that adding Co-Pi has no discernible effect on the $BiVO_4/WO_3$ absorption property. The UV-Vis absorption behavior of these photoanodes was further investigated by estimating their optical band gap using Tauc's plot [Tauc, J. Optical properties of amorphous semiconductors. In *Amorphous and liquid semiconductors*, Springer: 1974; pp. 159-220]. The results are shown in FIG. 3B. The optical band gap plot was created using the following Eqn. 3:

$$(ahv)^n = A(hv - E_g) \qquad (3)$$

where (v) is the light frequency, (h) is the Planck's constant, ($\alpha$) is the absorption coefficient, (n) is constant (=1/2 for in-direct bandgap, =2 for direct bandgap), (A) is constant, and $E_g$ is the optical bandgap.

The optical band gap of $WO_3$ film was estimated by extrapolating the liner part of $(ahv)^{1/2}$ versus the energy of the absorbed photon (indirect bandgap). The optical band gap of $WO_3$ was found to be 2.72 eV. On the other hand, the optical band gap of $BiVO_4$, $BiVO_4/WO_3$, and Co-Pi/$BiVO_4/WO_3$ were obtained by extrapolating the linear part of $(ahv)^2$ versus the energy of the absorbed photon (direct bandgap). The optical band gap of $BiVO_4$ film was estimated to be 2.35 eV. A narrower optical band gap was observed in the case of $BiVO_4/WO_3$ bilayer film than $BiVO_4$ film, which indicates that the heterostructure of $BiVO_4/WO_3$ photoanode has a better light-harvesting ability as compared to individual $BiVO_4$ and $WO_3$ photoanodes. Moreover, the addition of Co-Pi didn't affect the bandgap of $BiVO_4/WO_3$ film, which agrees with its absorption behavior.

Figure 4B:
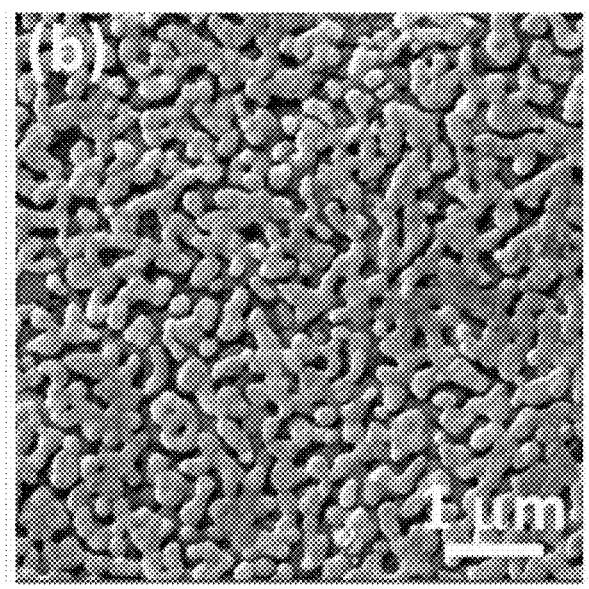
FIG. 4B is a FESEM image of BiVO$_4$, according to certain embodiments.
Figure 4C:
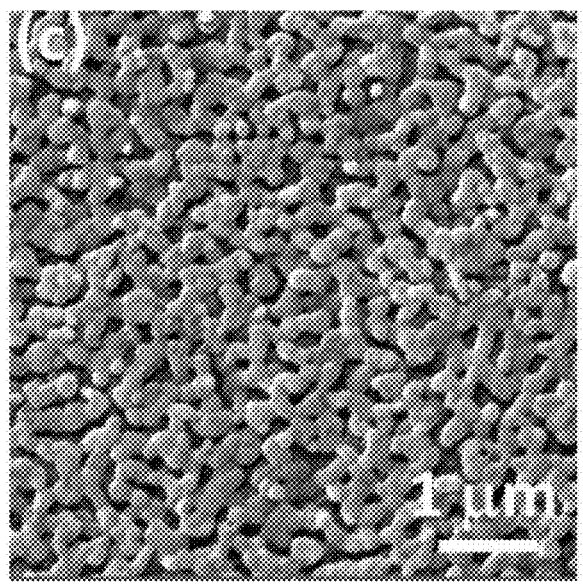
FIG. 4C is a FESEM image of BiVO$_4$/WO$_3$, according to certain embodiments.
Figure 4D:
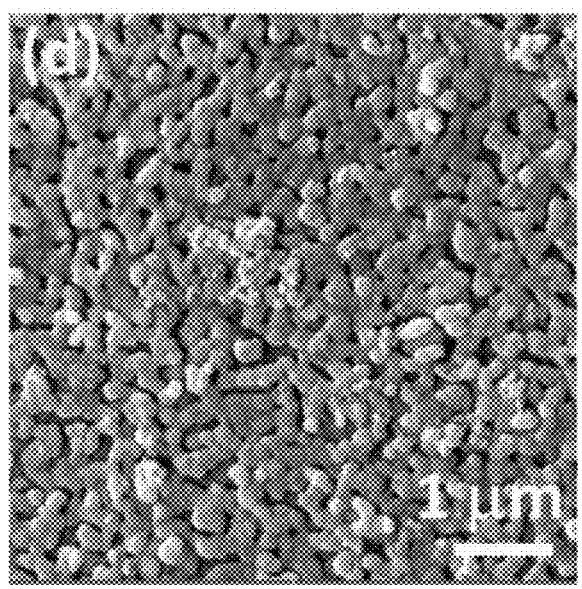
FIG. 4D is a FESEM image of Co-Pi modified BiVO$_4$/WO$_3$, according to certain embodiments.
Figure 4E:
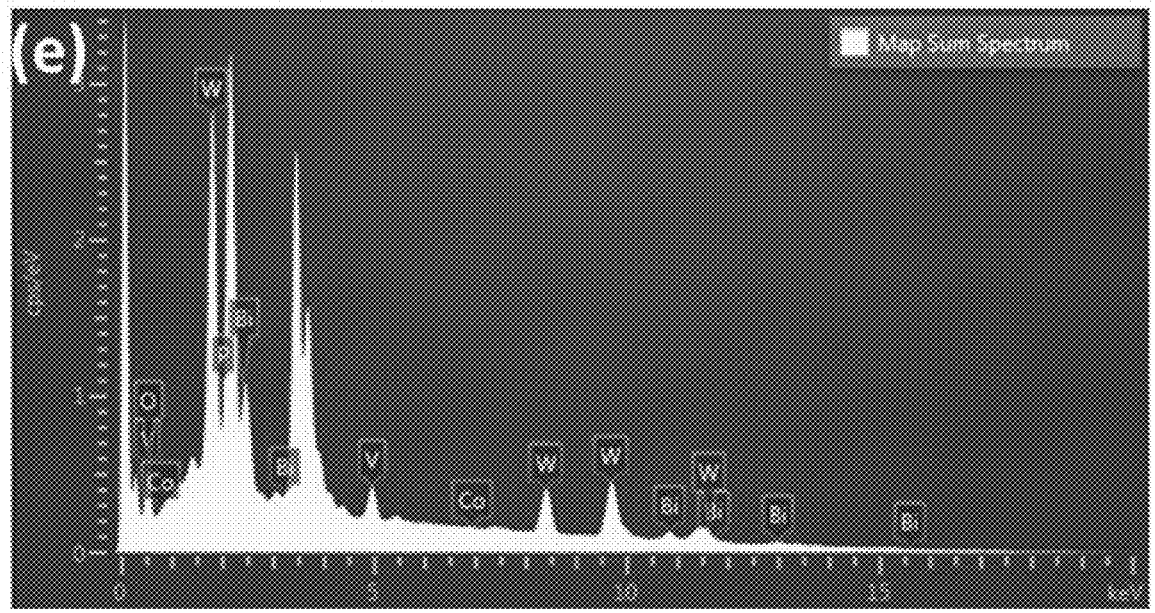
FIG. 4E illustrates an energy-dispersive detector (EDS) spectrum of Co-Pi modified BiVO$_4$/WO$_3$, according to certain embodiments.

Scanning electron microscopy (SEM) was used to examine the morphology of the synthesized $WO_3$, $BiVO_4$, $BiVO_4/WO_3$, and Co-Pi/$BiVO_4/WO_3$ photoanodes, which are shown in FIGS. 4A to 4E. The $WO_3$ film has a uniform textureless surface with few cracks, as revealed from FIG. 4A. The thickness of the $WO_3$ film was determined to be 156 nm, as previously reported [Mohamedkhair, A. K.; Drmosh, Q. A.; Qamar, M.; Yamani, Z. H. Tuning Structural Properties of $WO_3$ Thin Films for Photoelectrocatalytic Water Oxidation. *Catalysts* 2021, 11, 381]. The FIG. 4B illustrates the interparticle porosity structure morphology of the $BiVO_4$ film. This structure has a large surface area, which is beneficial to the oxygen evolution process. The $BiVO_4$ layer's thickness was measured and found to be around 330 nm (S3). The top view SEM image of the $BiVO_4/WO_3$ film from FIG. 4C, exhibits a similar structure as pure $BiVO_4$ film, indicating that the $BiVO_4$ film is uniformly deposited on the surface of the $WO_3$ film. The Co-Pi was deposited on $BiVO_4/WO_3$ film's surface in the form of a nanoparticle with an approximate diameter of 100 nm, as shown in FIG. 4D. The EDS spectrum of the Co-Pi/$BiVO_4/WO_3$ film, depicted in FIG. 4E, confirms the presence of the Co, P, Bi, V, W, and O elements. The EDS spectrum also contains peaks corresponding to the gold coating and the FTO glass substrate.

Example 7: Performance Evaluation of the Co-Pi/$BiVO_4/WO_3$ Photoanode for Water Oxidation The photoelectrochemical performance of the prepared photoelectrode was tested in a three-electrode quartz cell. The linear sweep voltammetry (LSV) was used to measure the activity of the representative electrodes in 0.5 M PBS. The effect of $WO_3$ thickness, obtained by adjusting the deposition time as 1, 5, 10, and 15 min, on the activity of the $BiVO_4/WO_3$ was investigated, and the obtained photocurrent-potential curve is presented in FIG. 5A. As clear, the photocurrent increased with increasing deposition time (or the thickness of the $WO_3$ film) from 1 to 10 min, followed by a decrease. With 10 min deposition time, the maximum photocurrent was recorded to be approximately 2.45 mA cm$^{-2}$ at 1.23 $V_{RHE}$. The $WO_3$ thickness seems to have significant impact on the charge transport properties, and hence on the PEC activity of the $BiVO_4/WO_3$. This has been discussed in detail in our in our previous article [Mohamedkhair, A. K.; Drmosh, Q. A.; Qamar, M.; Yamani, Z. H. Tuning Structural Properties of $WO_3$ Thin Films for Photoelectrocatalytic Water Oxidation. *Catalysts* 2021, 11, 381]. Briefly, compared to thick films, thinner films have a large number of grain boundaries that can scatter the charge carriers, which induces an electrical resistance. In case of the thicker films, however, increase in film thickness increases the charge's diffusion length and hence the film's resistance. A hole scavenger test was performed to further investigate the availability of holes and photocatalytic capability of the $BiVO_4/WO_3$ photoanodes. In this test, the current-potential curve was recorded in the presence of 0.5 M sodium sulfite ($Na_2SO_3$), which acts as an electron donor. Because of favored thermodynamic oxidation of sulfite over water, all photogenerated holes at the surface are likely to be consumed in sulfite oxidation process with a high charge transfer rate. The results are shown in FIG. 5B. As compared to water oxidation, significant increase in the photocurrent was observed because of sulfite oxidation—the $BiVO_4/WO_3$ produced ~4.7 mA cm$^{-2}$ at 1.23 $V_{RHE}$. This significant improvement indicates the formation and availability of a large number of holes in the $BiVO_4/WO_3$. Furthermore, the lower photocurrent density was observed in the 0.5 M PBS solution without $Na_2SO_3$ due to the slow water oxidation kinetic process and/or high electron-hole recombination at the surface of $BiVO_4/WO_3$ photoanode.

To minimize surface electron-hole recombination process, a co-catalyst Co-Pi was deposited onto the surface of the $BiVO_4/WO_3$ following the photoassisted-electrochemical deposition method. The deposition of the Co-Pi onto the surface of $BiVO_4/WO_3$ was optimized by varying potential between 0.1 and 0.4 V and time intervals at 30, 60, 90, and 120 sec. The LSVs recorded in presence of the $WO_3$, $BiVO_4$, $BiVO_4/WO_3$ and Co-Pi/$BiVO_4/WO_3$ are compared in FIG. 5C. The Co-Pi deposition was carried out at 0.3 V at 90 sec. Modification of the $BiVO_4/WO_3$ surface with Co-Pi has significant impact on its photocatalytic activity. The photocurrent reached to 3.7 mA cm$^{-2}$ at 1.23 $V_{RHE}$, which is approximately 66% higher than the photocurrent generated by the bare $BiVO_4/WO_3$ photoanode and ~275% higher than the $BiVO_4$ and $WO_3$ photoanodes.

The chronoamperometry of the Co-Pi/$BiVO_4/WO_3$, $BiVO_4/WO_3$, $BiVO_4$, and $WO_3$ photoanodes recorded under intermittent illumination at 1.23 $V_{RHE}$ are compared in FIG. 5D. The photocurrent produced by $BiVO_4/WO_3$ was ~2.3 mA cm$_{-2}$, which was 3 times higher than that of the $BiVO_4$ (~1.0 mA cm$^{-2}$) and 2 times higher than that of the $WO_3$ (~0.85 mA cm$^{-2}$). This indicates that the heterojunction structure of $BiVO_4/WO_3$ is more photoactive, as electron injection from $BiVO_4$ to $WO_3$ is more favorable which suppress the bulk recombination due to the formation of internal electric filed at the $BiVO_4/WO_3$ interface. Moreover, the surface modification of the $BiVO_4/WO_3$ with Co-Pi further suppresses the recombination and improves the rate of hole transfer at the semiconductor electrolyte interface. When the light is turned off, all samples exhibit almost zero currents, indicating that the observed current is photocurrent instead of current produced by any electrocatalytic activity. All the photoelectrodes showed good stability for at least five cycles measured at 60 second time intervals. The stability of the photoanodes was further examined for 2 h illumination at 1.23 $V_{RHE}$, as shown in FIG. 5E. The steady photocurrent of the Co-Pi/$BiVO_4/WO_3$, $BiVO_4/WO_3$, $BiVO_4$, and $WO_3$ photoanodes, demonstrated quite good stability throughout the illumination period. FIG. 5F shows the incident photon-to-current efficiency (IPCE) of the Co-Pi/$BiVO_4/WO_3$, $BiVO_4/WO_3$, $BiVO_4$, and $WO_3$ photoanodes recorded at 1.23 $V_{RHE}$ under different wavelengths. At 430 nm wavelength, the efficiency of the Co-Pi/$BiVO_4/WO_3$ photoanode was ~25%, while respective efficiencies of the $BiVO_4/WO_3$, $BiVO_4$, and $WO_3$ photoanode were determined to be ~16%, ~7%, and ~6%. The increase in the IPCE value of the Co-Pi/$BiVO_4/WO_3$ compared to the bare $BiVO_4/WO_3$ was due to the loading of the Co-Pi on the $BiVO_4/WO_3$ film's surface and not due to the narrower bandgap as shown by the UV-Vis results. It seems the Co-Pi loading on $BiVO_4/WO_3$ suppresses the recombination rate and enhance the charge transfer process at semiconductor electrolyte interface (SEI). Furthermore, the enhancement in IPCE of the $BiVO_4/WO_3$ compared to the $BiVO_4$ and $WO_3$ was due to improved electron-hole separation at the heterostructure junction and light absorption.

Figure 6A:
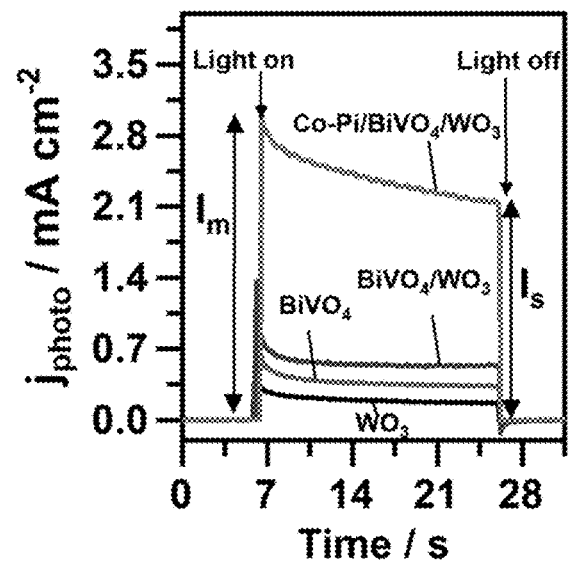
FIG. 6A is an overlay of transient photocurrent (TPC) response of Co-Pi modified BiVO$_4$/WO$_3$, BiVO$_4$/WO$_3$, BiVO$_4$, and WO$_3$ photoanodes performed at 0.9 V$_{RHE}$ under standard illumination conditions, according to certain embodiments.

The qualitative assessment of charge transfer and electron-hole recombination at SEI was obtained by transient photocurrent (TPC) decay time measurement. The experiment was performed at 0.9 $V_{RHE}$, and the results are shown in in FIG. 6A [Zhang, L.; Reisner, E.; Baumberg, J. J. Al-doped ZnO inverse opal networks as efficient electron collectors in $BiVO_4$ photoanodes for solar water oxidation. *Energy & Environmental Science* 2014, 7, 1402-1408]. Upon light illumination, an anodic spike ($I_m$) is observed as a result of the sudden generation of charge carriers, followed by immediate charge recombination resulting in a gradual decrease in photocurrent and then reaching to a stabilized photocurrent ($I_s$). During stabilized photocurrent, the rate of photogenerated holes transfer to the surface is balanced by the rate of electron-hole pair recombination and hole transfer rate for water oxidation process at the SEI. When the light is turned off, the conduction band electrons recombine with the trapped holes at the surface and give cathodic spike and then stabilized to zero photocurrent [Zhang, L.; Reisner, E.; Baumberg, J. J. Al-doped ZnO inverse opal networks as efficient electron collectors in $BiVO_4$ photoanodes for solar water oxidation. *Energy & Environmental Science* 2014, 7, 1402-1408]. To gain further insight of the lifetime of trapped holes at surface states, the transient decay times (τ) of the $Co-Pi/BiVO_4/WO_3$, $BiVO_4/WO_3$, $BiVO_4$, and $WO_3$ photoanodes were deduced. The Eqn. (4) was used to determine the normalized parameter (D) from the TPC response;

$$D = (I_t - I_s)/(I_m - I_s) \quad (4)$$

where $I_t$, $I_m$, and $I_s$ are time-dependent current, anodic photocurrent spike, and steady-state current, respectively.

Figure 6B:
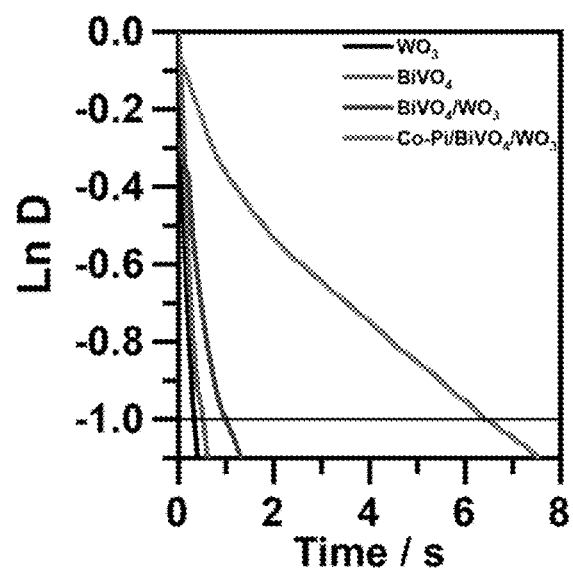
FIG. 6B is an overlay of transient decay time of Co-Pi modified BiVO$_4$/WO$_3$, BiVO$_4$/WO$_3$, BiVO$_4$, and WO$_3$ photoanodes performed at 0.9 $V_{RHE}$ under standard illumination conditions, according to certain embodiments.

The time (τ) at which In D=−1 is referred as the transient decay time [Zhang, L.; Reisner, E.; Baumberg, J. J. Al-doped ZnO inverse opal networks as efficient electron collectors in $BiVO_4$ photoanodes for solar water oxidation. *Energy & Environmental Science* 2014, 7, 1402-1408], as illustrated in FIG. 6B. The transient decay time is directly proportional to the lifetime of holes available at SEI for water oxidation [Zhang, J.; Garcia-Rodríguez, R.; Cameron, P.; Eslava, S. Role of cobalt—iron (oxy) hydroxide (CoFeO x) as oxygen evolution catalyst on hematite photoanodes. *Energy & Environmental Science* 2018, 11, 2972-2984]. The transient decay time of the $WO_3$, $BiVO_4$, $BiVO_4/WO_3$, and $Co-Pi/BiVO_4/WO_3$ photoanodes were measured to be 0.3, 0.5, 0.9, and 6.5 s, respectively. The decay time of the $BiVO_4/WO_3$ is higher than that of $BiVO_4$ and $WO_3$ photoanodes. This is ascribed to the enhanced charge separation mechanism operative at the $BiVO_4/WO_3$ interface by the heterostructure junction and leads to inhibition of the charge recombination at SEI. The deposition of Co-Pi onto the surface of the $BiVO_4/WO_3$ films further reduced the electron-hole surface recombination and prolonged the lifetime of photogenerated holes at SEI, which was effectively utilized for water oxidation process. Thus, the photogenerated holes in the $Co-Pi/BiVO_4/WO_3$ photoanode have approximately seven-fold longer lifetime than that of the $BiVO_4/WO_3$, providing enough time for enhanced water oxidation kinetics. These results are consistent with the current-potential curve for the representative photoanodes as depicted in FIG. 5C.

The Mott-Schottky (M-S) plots can be used to determine the flat-band potential ($E_{fb}$) and carrier density ($N_d$) for the fabricated photoanodes [Ahmed, A. Y.; Ahmed, M. G.; Kandiel, T. A. Hematite photoanodes with size-controlled nanoparticles for enhanced photoelectrochemical water oxidation. *Applied Catalysis B: Environmental* 2018, 236, 117-124]. As shown in FIG. 7A, the n-type characteristic property was observed from M-S positive slope for all $WO_3$, $BiVO_4$, $BiVO_4/WO_3$, and $Co-Pi/BiVO_4/WO_3$ photoanodes. The Eth and Na were extracted from the M-S equation, Eqn. (5):

$$\frac{1}{C_{SC}^2} = \frac{2}{q\varepsilon\varepsilon_0 A^2 N_d}\left(E - E_{fb} - \frac{kT}{q}\right) \quad (5)$$

where $C_{sc}$ is the space charge layer capacitance (F cm$^{-2}$), $\varepsilon_0$ is the vacuum permittivity (8.85×10$^{-12}$ N$^{-1}$C$^2$ m$^{-2}$) ε is the relative dielectric constant of $BiVO_4$ (68) [Ma, Y.; Pendlebury, S. R.; Reynal, A.; Le Formal, F.; Durrant, J. R. Dynamics of photogenerated holes in undoped BiVO 4 photoanodes for solar water oxidation. *Chemical Science* 2014, 5, 2964-2973], q is the elementary charge (1.60×10$^{-19}$ C), $N_d$ is the carrier density (cm$^{-3}$), A is the geometrical area in (cm$^2$), Eth is the flat band potential (V), E is the applied potential (V), T is the absolute temperature (298 K), and k is the Boltzmann constant (1.38×10$^{-23}$ J K$^{-1}$).

The flat band potentials of the photocatalytic samples were determined by extrapolating the linear part of the M-S curves to the potential axis. The $E^{fb}$ of $WO_3$, $BiVO_4$, $BiVO_4/WO_3$, and $Co-Pi/BiVO_4/WO_3$ were found to be 0.70, 0.68, 0.52, and 0.35 $V_{RHE}$, respectively. The cathodic shift in the Eth value indicates an upward shift in the Fermi level, which tends to improve the charge carrier separation of the photoanode [Sun, H.; Hua, W.; Li, Y.; Wang, J.-G. Promoting photoelectrochemical activity and stability of $WO_3/BiVO_4$ heterojunctions by coating a tannin nickel iron complex. *ACS Sustainable Chemistry & Engineering* 2020, 8, 12637-1264]. Furthermore, the lower Eth potential of the $BiVO_4/WO_3$ and $Co-Pi/BiVO_4/WO_3$ as compared to the $BiVO_4$ and $WO_3$ photoanodes indicates a lower bias voltage required to drive the oxygen evolution reaction [Sun, H.; Hua, W.; Li, Y.; Wang, J.-G. Promoting photoelectrochemical activity and stability of $WO_3/BiVO_4$ heterojunctions by coating a tannin nickel iron complex. *ACS Sustainable Chemistry & Engineering* 2020, 8, 12637-1264]. The shallow slope in the M-S linear part indicates a higher concentration of charge carriers available at the space-charge region. The maximum charge carrier concentration of $Co-Pi/BiVO_4/WO_3$ electrode is because of the long lifetime of the photogenerated holes rendered by the Co-Pi co-catalyst.

Figure 7B:
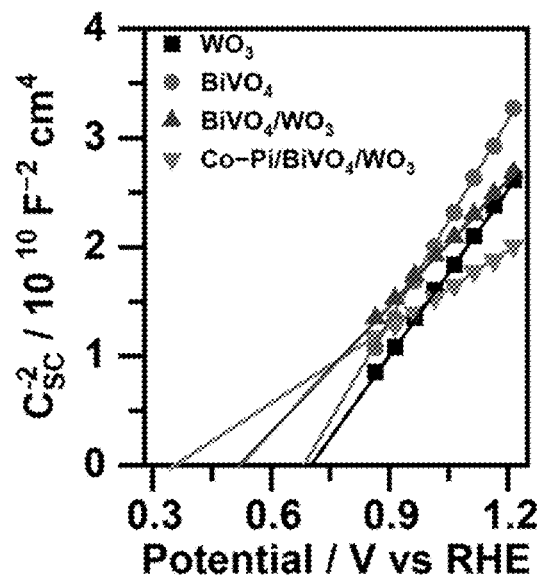
FIG. 7B is an overlay of Nyquist plots of Co-Pi modified $BiVO_4/WO_3$, $BiVO_4/WO_3$, $BiVO_4$, and $WO_3$ photoanodes under standard illumination conditions, according to certain embodiments.
Figure 8:
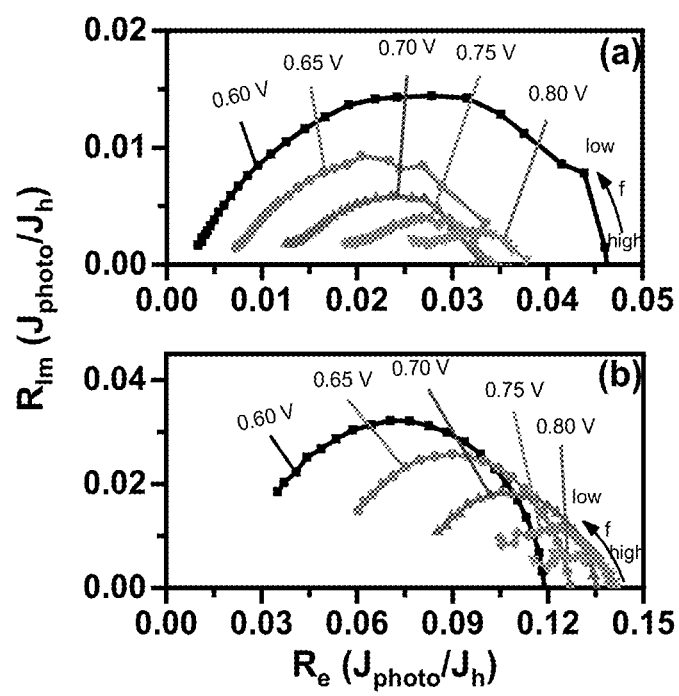
FIG. 8 illustrates an intensity modulated photocurrent spectroscopy (IMPS) spectra of (a) $BiVO_4/WO_3$ and (b) Co-Pi modified $BiVO_4/WO_3$ as a function of applied potentials, according to certain embodiments.

Electrochemical impedance spectroscopy (EIS) was employed to gain further insight about charge carrier kinetics operative at semiconductor electrolyte interface. FIG. 7B shows Nyquist plots of the different photoelectrodes obtained at 0.9 $V_{RHE}$ under illumination. The Nyquist plots were fitted with the equivalent circuit (as shown in FIG. 8) to examine their charge transfer resistance ($R_{ct}$). The $R_{ct}$ of the $Co-Pi/BiVO_4/WO_3$, $BiVO_4/WO_3$, $BiVO_4$, and $WO_3$ were calculated to be ~0.20, ~0.45, ~1.0, and ~1.3 kΩ respectively. The lower $R_{ct}$ value in case of the $BiVO_4/WO_3$ than $WO_3$ and $BiVO_4$ photoanodes indicated faster interfacial charge transport at the $BiVO_4/WO_3$ and water interface [Sun, H.; Hua, W.; Li, Y.; Wang, J.-G. Promoting photoelectrochemical activity and stability of $WO_3/BiVO_4$ heterojunctions by coating a tannin nickel iron complex. *ACS Sustainable Chemistry & Engineering* 2020, 8, 12637-1264]. The $R_{ct}$ of $BiVO_4/WO_3$ further decreased after Co-Pi modification. This suggested that the Co-PI is capable of capturing and transferring holes from $BiVO_4$ surface to water more efficiently. These findings are in good agreement with the LSV and TPC results.

Figure 9A:
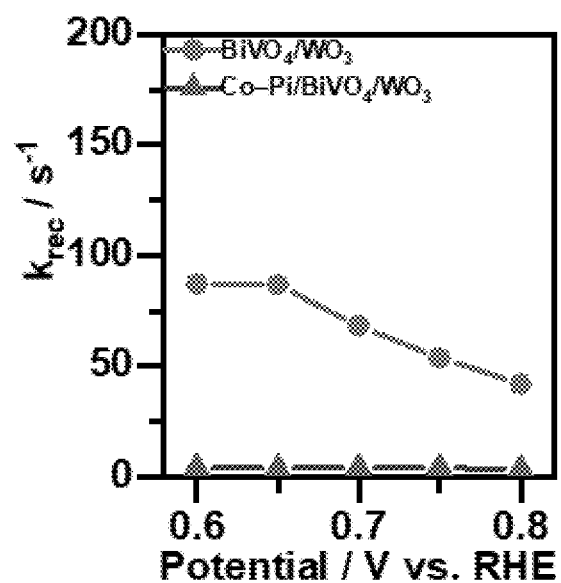
FIG. 9A is a rate constant plot of charge recombination ($k_{rec}$) of Co-Pi modified $BiVO_4/WO_3$, and $BiVO_4/WO_3$ as a function of applied potentials, according to certain embodiments.
Figure 9B:
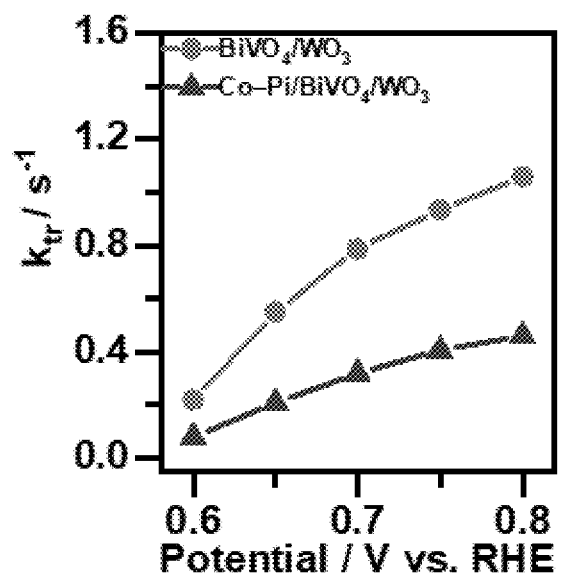
FIG. 9B is a rate constant plot of charge transfer ($k_{tr}$) of Co-Pi modified $BiVO_4/WO_3$, and $BiVO_4/WO_3$ as a function of applied potentials, according to certain embodiments.
Figure 9C:
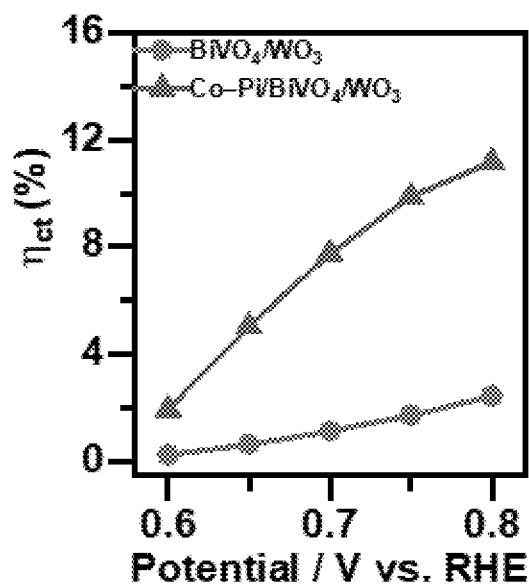
FIG. 9C is a rate constant plot of charge transfer efficiency ($\eta_{ct}$ %) of Co-Pi modified $BiVO_4/WO_3$, and $BiVO_4/WO_3$ as a function of applied potentials, according to certain embodiments.

To understand the origin of enhanced photocurrent by the $BiVO_4/WO_3$ after modification with Co-Pi, intensity-modulated photocurrent spectroscopy (IMPS) is used. IMPS is a powerful technique to analyze the surface kinetics of the photoelectrodes at SEI. Recently, Zhang et al [Zhang, J.; García-Rodríguez, R.; Cameron, P.; Eslava, S. Role of cobalt—iron (oxy) hydroxide (CoFeO x) as oxygen evolution catalyst on hematite photoanodes. *Energy & Environmental Science* 2018, 11, 2972-2984] utilized a simple model of IMPS technique on hematite-based photoanodes to study the rate of charge transfer kinetics occurring at SEI for water oxidation process while competing with the recombination. A typical IMPS spectrum of $BiVO_4/WO_3$ photoanode recorded at 0.7 $V_{RHE}$ is shown in FIG. 8. The spectrum confirmed the n-type semiconducting property of BiVO$_4$/WO$_3$. It consists of two semicircles in the first and the fourth quadrants with two intercepts. The low-frequency intercepts (LFI) indicate the successful injection of holes into the electrolytes for water oxidation and relate to surface charge transfer efficiency ($\eta_{ct}$). On the other hand, the high-frequency intercepts (HFI) suggest the holes reaching to the surface before the recombination process takes place [Khan, A. Z.; Kandiel, T. A.; Abdel-Azeim, S.; Jahangir, T. N.; Alhooshani, K. Phosphate ions interfacial drift layer to improve the performance of CoFe— Prussian blue hematite photoanode toward water splitting. *Applied Catalysis B: Environmental* 2022, 304, 121014]. The rates of charge transfer ($k_{tr}$) and recombination ($k_{rec}$) in the Co-Pi/BiVO$_4$/WO$_3$ and BiVO$_4$/WO$_3$ photoanodes at different potentials can be evaluated by taking the first quadrant of the IMPS spectra, as shown in FIG. 8. The $\eta_{ct}$ is equal to $k_{tr}/(k_{tr}+k_{rec})$, whereas $\omega_{max}=2\pi f_{max}=k_{tr}+k_{rec}$ [Zhang, J.; García-Rodríguez, R.; Cameron, P.; Eslava, S. Role of cobalt—iron (oxy) hydroxide (CoFeO x) as oxygen evolution catalyst on hematite photoanodes. *Energy & Environmental Science* 2018, 11, 2972-2984]. The $k_{tr}$ and $k_{rec}$ at different potentials are then calculated by using $\omega_{max}$ and low-frequency intercept for the Co-Pi/BiVO$_4$/WO$_3$ and BiVO$_4$/WO$_3$. The results are presented in FIGS. 9A to 9C. It is noticed that the $k_{rec}$ of Co-Pi/BiVO$_4$/WO$_3$ photoanode is lower than that of BiVO$_4$/WO$_3$, which is consistent with the findings of transient decay time from TPC spectra. Surprisingly, the $k_{tr}$ of Co-Pi/BiVO$_4$/WO$_3$ is less than BiVO$_4$/WO$_3$ over the entire potential window, which suggests that Co-Pi mainly acts as a passivating agent and significantly reduces the surface recombination taking place at the surface of BiOV$_4$/WO$_3$. Furthermore, the charge transfer efficiencies of Co-Pi/BiVO$_4$/WO$_3$ and BiVO$_4$/WO$_3$ photoanodes have been calculated from Eqn. 6, and presented in the FIG. 9C. The Co-Pi/BiVO$_4$/WO$_3$ have lower rates of $k_{tr}$ and $k_{rec}$ than BiVO$_4$/WO$_3$, but the charge transfer efficiency is higher, and the trend is consistent with the results obtained in the J-V curve in LSV from FIG. 5C.

Example 8: Charge Transfer Mechanism of Photo-Induced Charge Carriers in Co-Pi/BiVO$_4$/WO$_3$ Photoanode An attempt is made to explain the charge transfer mechanism of water oxidation process taking place onto the surface of Co-Pi/BiVO$_4$/WO$_3$ photoanode considering the band alignment of semiconductor photocatalysts. The optical bandgap of the BiVO$_4$ and WO$_3$ photoanodes were calculated to be 2.37 and 2.72 eV, as shown in FIG. 3B. The valence band (VB) and the conduction band (CB) edges of a photocatalyst can be deduced, with respect to hydrogen scale, using the following equations, Eqn. (7a, b) [Pyper, K. J.; Yourey, J. E.; Bartlett, B. M. Reactivity of CuWO4 in photoelectrochemical water oxidation is dictated by a midgap electronic state. *The Journal of Physical Chemistry C* 2013, 117, 24726-24732].

$$E_{VB}=x-E^e+0.5E_g \tag{7a}$$

$$E_{CB}=E_{VB}-E_g \tag{7b}$$

where $E_{VB}$ and $E_{CB}$ are the valence band and the conduction band energies, x is the electronegativity of the semiconductor photocatalyst (6.59 eV for WO$_3$ and 6.04 eV for BiVO$_4$) [Madhavi, V.; Kondaiah, P.; Shaik, H.; Kumar, K. N.; Naik, T. S. K.; Rao, G. M.; Ramamurthy, P. C. Fabrication of porous 1D WO$_3$ NRs and WO$_3$/BiVO$_4$ hetero junction photoanode for efficient photoelectrochemical water splitting. *Materials Chemistry and Physics* 2021, 274, 125095], $E^e$ is the hydrogen-free electron energy (4.5 eV), and $E_g$ is the bandgap of the semiconductor photoanode.

As shown in FIG. 10, BiVO$_4$ and WO$_3$ photoanodes have valence band (VB) edges at 2.71 eV and 3.45 eV, respectively, and conduction band edges (CB) at 0.36 eV and 0.73 eV. As a result, the layers of BiVO$_4$ and WO$_3$ will form a type-II heterojunction. Because the VB edge of the WO$_3$ is more positive than that of the BiVO$_4$, the holes generated in WO$_3$ are likely to move to the VB of BiVO$_4$. Similarly, as the CB edge of BiVO$_4$ layer's is less positive than that of the WO$_3$, the electron from the BiVO$_4$ CB is expected to be transferred to the WO$_3$ CB. An increase in the density of holes available at the BiVO$_4$ VB boosts the oxygen evolution reaction. On the other hand, additional electrons, transferred from BiVO$_4$, will be transferred to the counter electrode for the hydrogen evolution reaction. Surface modification of the BiVO$_4$/WO$_3$ with Co-Pi can increase the lifetime of the accumulated holes at the photoanode/electrolyte interface. The extended lifetime of the photogenerated holes leads to high probability for these holes to be utilized in water oxidation process. In absence of the Co-Pi, electron-hole pair recombination can be a dominant phenomenon, which is a major energy wasting step in photocatalytic process. A schematic showing plausible charge transfer among WO$_3$, BiVO$_4$ and Co-Pi is presented in FIG. 10.

Numerous modifications and variations of the present disclosure are possible in light of the above teachings. It is therefore to be understood that within the scope of the appended claims, the invention may be practiced otherwise than as specifically described herein.

The invention claimed is:

1. A method for coating a substrate with a Co-Pi modified BiVO$_4$/WO$_3$ heterostructure film, comprising:
   direct current reactive sputtering tungsten (W) onto a substrate in a gaseous mixture comprising oxygen to form a tungsten trioxide (WO$_3$) film on the substrate;
   direct current reactive sputtering bismuth (Bi) onto the tungsten trioxide (WO$_3$) film in a gaseous mixture comprising oxygen to form a dibismuth trioxide (Bi$_2$O$_3$) film on the WO$_3$ film;
   drop-casting a vanadyl acetylacetonate solution onto the Bi$_2$O$_3$ film and heating at a temperature of at least 450° C. in ambient air to convert the Bi$_2$O$_3$ film to a BiVO$_4$ film;
   wherein the BiVO$_4$ film is a porous film comprising crystalline BiVO$_4$;
   immersing the BiVO$_4$ film on the substrate in an aqueous mixture containing a cobalt salt and a phosphate salt;
   photoelectrochemically coating the BiVO$_4$ film with a cobalt-phosphate (Co-Pi) to form a modified film on the surface of the substrate.

2. The method of claim 1, wherein direct current reactive sputtering tungsten onto the substrate is carried out at a power of 50 to 200 watts (W) for 1 to 30 minutes and the gaseous mixture is introduced at a flow rate of 50 to 100 standard cubic centimeters per minute (sccm).

3. The method of claim 1, wherein a distance of tungsten source to the substrate is in a range of 5 to 20 centimeters (cm).

4. The method of claim 1, wherein direct current reactive sputtering bismuth onto the WO$_3$ film is carried out at a power of 5 to 50 W for 1 to 30 minutes and the gaseous mixture is introduced at a flow rate of 10 to 70 sccm.

5. The method of claim 1, wherein a base pressure of the sputtering is maintained at $1\times10^{-6}$ to $20\times10^{-6}$ torr, and a working pressure of the sputtering is maintained at $1\times10^{-3}$ to $10\times10^{-3}$ torr.

6. The method of claim 1, further comprising heating the $WO_3$ film in ambient air at a temperature of at least 500° C. for 1 to 3 hours with a heating ramp rate of 10 to 30° C./min.

7. The method of claim 1, wherein the heating of the $Bi_2O_3$ film after drop casting is carried out for 1 to 3 hours with a heating ramp rate of 0.5 to 5° C./min.

8. The method of claim 1, wherein the gaseous mixture comprises oxygen gas and argon gas, wherein a volume ratio of oxygen gas to argon gas is in a range of 1:10 to 10:1.

9. The method of claim 1, wherein the $WO_3$ film has:
a uniform sheet-like morphology;
an average thickness of 50 to 250 nanometers (nm); and
a photocurrent density of 0.5 to 1 milliamperes per square centimeter (mA cm$^{-2}$) at 1.23 $V_{RHE}$.

10. The method of claim 1, wherein the $Bi_2O_3$ film has an interparticle porosity structure, and is uniformly deposited on the surface of the $WO_3$ film.

11. The method of claim 1, wherein the $BiVO_4$ film has:
an average pore size of 0.01 to 1 micrometer (μm);
an average thickness of 100 to 600 nm; and
a photocurrent density of 0.8 to 1.5 mA cm$^{-2}$ at 1.23 $V_{RHE}$.

12. The method of claim 1, wherein the Co-Pi modified $BiVO_4/WO_3$ heterostructure film is uniform and pinhole-free, and comprises a plurality of Co-Pi particles uniformly distributed on the modified film.

13. The method of claim 12, wherein the Co-Pi particles have an average particle size of 20 to 200 nm.

14. The method of claim 1, wherein the Co-Pi modified $BiVO_4/WO_3$ heterostructure film has a thickness in a range of 150 to 850 nm.

15. The method of claim 1, further comprising:
mixing at least one cobalt (Co) salt and at least one phosphate (Pi) salt in a liquid to form the aqueous mixture having a pH value ranging from 5.5 to 7.5;
wherein a molar ratio of Co to Pi is in a range of 1:50 to 1:400;
adding the aqueous mixture to a photoelectrochemical cell connected to a power supply;
at least partially immersing the substate coated with the $BiVO_4$ film in the aqueous mixture;
wherein the substate is a fluorinated tin oxide (FTO) glass;
applying a potential to the aqueous mixture via the substrate to form a plurality of cobalt-phosphate (Co-Pi) particles on the surface of the $BiVO_4$ film;
removing the substrate from the aqueous mixture and drying to form the modified film on the surface of the substrate.

16. The method of claim 15, wherein the cobalt salt is at least one selected from the group consisting of cobalt sulfide, cobalt fluoride, cobalt naphthenate, cobalt acetate, cobalt monoantimonide, cobalt oxide, cobalt triantimonide, cobalt hydroxide, cobalt chloride, cobalt thiocyanate, cobalt acetylacetonate, cobalt sulfate, cobalt carbonyl, cobalt nitrate, cobalt bromide, and/or a hydrate thereof.

17. The method of claim 15, wherein the phosphate salt is at least one selected from the group consisting of sodium phosphate, sodium phosphate dibasic, sodium phosphate monobasic, potassium phosphate, potassium phosphate dibasic, potassium phosphate monobasic, and/or a hydrate thereof.

* * * * *